US00RE50670E

(19) United States
(12) Reissued Patent
Yang et al.

(10) Patent Number: US RE50,670 E
(45) Date of Reissued Patent: Nov. 18, 2025

(54) ELECTROLUMINESCENCE DISPLAY DEVICE

(71) Applicant: LG Display Co., Ltd., Seoul (KR)

(72) Inventors: Yeongyun Yang, Mokpo-si (KR); Bonggeum Lee, Goyang-si (KR); WonKeun Park, Seoul (KR); Sohee Yu, Seoul (KR); Hanyoung Cho, Seoul (KR)

(73) Assignee: LG Display Co., Ltd., Seoul (KR)

(21) Appl. No.: 18/492,527

(22) Filed: Oct. 23, 2023

Related U.S. Patent Documents

Reissue of:
(64) Patent No.: 10,367,045
Issued: Jul. 30, 2019
Appl. No.: 16/005,526
Filed: Jun. 11, 2018

U.S. Applications:
(62) Division of application No. 15/608,734, filed on May 30, 2017, now Pat. No. 10,020,351.

(30) Foreign Application Priority Data

Jun. 24, 2016 (KR) ..... 10-2016-0079398
Jul. 26, 2016 (KR) ..... 10-2016-0094623
Nov. 11, 2016 (KR) ..... 10-2016-0150348

(51) Int. Cl.
*H01L 27/32* (2006.01)
*H01L 51/52* (2006.01)
(Continued)

(52) U.S. Cl.
CPC ..... *H10K 59/122* (2023.02); *H10D 30/6723* (2025.01); *H10D 86/441* (2025.01);
(Continued)

(58) Field of Classification Search
CPC ..... H10K 59/122; H10K 59/8792
See application file for complete search history.

(56) References Cited

U.S. PATENT DOCUMENTS 8,314,435 B2 * 11/2012 Lee ..... H10K 50/166 257/89
8,357,938 B2 1/2013 Yoon et al.
(Continued)

FOREIGN PATENT DOCUMENTS

JP 2005-338796 A 12/2005
JP 2009-212042 A 9/2009
(Continued)

OTHER PUBLICATIONS

Korean Intellectual Property Office, Notice of Allowance, Korean Patent Application No. 10-2016-0094623, Jun. 17, 2024, five pages.
(Continued)

*Primary Examiner* — Deandra M Hughes
(74) *Attorney, Agent, or Firm* — Fenwick & West LLP

(57) ABSTRACT

Embodiments disclosed herein relate to an electroluminescence display device including a first electrode, a second electrode facing the first electrode, an emission layer between the first electrode and the second electrode, and a bank layer defining the emission layer. The bank layer may be disposed between the first electrode and the second electrode. The bank layer may include a first bank layer and a second bank layer. The second bank layer may include a black pigment. The first bank layer may be closer to the first electrode than the second bank layer, and the first bank layer may have a lower permittivity than the second bank layer.

27 Claims, 19 Drawing Sheets

(51) Int. Cl.

| | |
|---|---|
| ***H10D 30/67*** | (2025.01) |
| ***H10D 86/40*** | (2025.01) |
| ***H10D 86/60*** | (2025.01) |
| ***H10K 50/11*** | (2023.01) |
| ***H10K 50/818*** | (2023.01) |
| ***H10K 50/828*** | (2023.01) |
| ***H10K 50/858*** | (2023.01) |
| ***H10K 50/86*** | (2023.01) |
| ***H10K 59/12*** | (2023.01) |
| ***H10K 59/121*** | (2023.01) |
| ***H10K 59/122*** | (2023.01) |
| ***H10K 59/123*** | (2023.01) |
| ***H10K 59/124*** | (2023.01) |
| ***H10K 59/126*** | (2023.01) |
| *H10K 101/10* | (2023.01) |
| *H10K 102/00* | (2023.01) |

(52) U.S. Cl.

CPC ..... *H10D 86/60* (2025.01); *H10K 50/11* (2023.02); *H10K 50/818* (2023.02); *H10K 50/828* (2023.02); *H10K 50/858* (2023.02); *H10K 50/865* (2023.02); *H10K 59/12* (2023.02); *H10K 59/121* (2023.02); *H10K 59/1213* (2023.02); *H10K 59/123* (2023.02); *H10K 59/124* (2023.02); *H10K 59/126* (2023.02); *H10K 59/1201* (2023.02); *H10K 2101/10* (2023.02); *H10K 2102/3026* (2023.02); *H10K 2102/351* (2023.02)

(56) References Cited

U.S. PATENT DOCUMENTS

| | | | | |
|---|---|---|---|---|
| 8,597,965 | B2 | 12/2013 | Hatano et al. | |
| 9,076,739 | B2 | 7/2015 | Choi et al. | |
| 9,515,291 | B2 | 12/2016 | Kudo et al. | |
| 9,608,045 | B2 | 3/2017 | Matsumoto et al. | |
| 10,007,154 | B2 * | 6/2018 | Park | G02F 1/13394 |
| 10,020,467 | B2 | 7/2018 | Kudo et al. | |
| 10,243,170 | B2 | 3/2019 | Kudo et al. | |
| 10,541,383 | B2 | 1/2020 | Kudo et al. | |
| 11,349,100 | B2 | 5/2022 | Kudo et al. | |
| 2003/0201716 | A1 * | 10/2003 | Yamazaki | H10K 59/80518 313/506 |
| 2005/0046342 | A1 * | 3/2005 | Park | H10K 50/856 313/506 |
| 2006/0284204 | A1 * | 12/2006 | Yamazaki | H01L 27/322 257/98 |
| 2008/0174846 | A1 | 7/2008 | Morozumi et al. | |
| 2009/0011278 | A1 * | 1/2009 | Choi | H01L 51/5234 428/690 |
| 2009/0322657 | A1 * | 12/2009 | Na | H10K 59/878 345/76 |
| 2012/0049215 | A1 | 3/2012 | Yoon et al. | |
| 2012/0286312 | A1 * | 11/2012 | Hatano | H10K 71/00 257/E33.061 |
| 2014/0159067 | A1 * | 6/2014 | Sakariya | H01L 24/24 257/88 |
| 2014/0284572 | A1 | 9/2014 | Ooka et al. | |
| 2014/0306198 | A1 * | 10/2014 | Im | H10K 59/121 438/34 |
| 2014/0353595 | A1 | 12/2014 | Choi et al. | |
| 2015/0000090 | A1 | 1/2015 | Carver et al. | |
| 2015/0008403 | A1 | 1/2015 | Kudo et al. | |
| 2015/0014663 | A1 | 1/2015 | Kwak et al. | |
| 2015/0053956 | A1 * | 2/2015 | Sato | H01L 51/5246 257/40 |
| 2015/0060805 | A1 | 3/2015 | Aonuma | |
| 2015/0060820 | A1 * | 3/2015 | Takagi | H10K 59/80518 438/46 |
| 2015/0144919 | A1 | 5/2015 | Matsumoto et al. | |
| 2015/0249119 | A1 * | 9/2015 | In | H01L 27/3269 257/40 |
| 2015/0371573 | A1 * | 12/2015 | Choi | H01L 51/5284 345/206 |
| 2015/0372070 | A1 | 12/2015 | Yoon et al. | |
| 2016/0004356 | A1 | 1/2016 | Ogikubo et al. | |
| 2016/0071911 | A1 * | 3/2016 | Lee | H01L 51/5284 257/40 |
| 2016/0181562 | A1 * | 6/2016 | Pieh | H01L 51/5218 257/40 |
| 2016/0218157 | A1 | 7/2016 | Ahn | |
| 2016/0365386 | A1 | 12/2016 | Liu et al. | |
| 2017/0062768 | A1 | 3/2017 | Kudo et al. | |
| 2017/0063374 | A1 | 3/2017 | Yamamoto | |
| 2017/0133437 | A1 * | 5/2017 | Komatsu | H01L 27/3206 |
| 2017/0186831 | A1 * | 6/2017 | Nam | H01L 27/3272 |
| 2017/0236893 | A1 | 8/2017 | Ooka et al. | |
| 2018/0190730 | A1 * | 7/2018 | Cho | H10K 59/873 |
| 2018/0269429 | A1 | 9/2018 | Kudo et al. | |
| 2018/0374909 | A1 * | 12/2018 | Nishikiori | H01L 27/3223 |
| 2019/0006626 | A1 * | 1/2019 | Kim | H01L 51/5271 |
| 2019/0148675 | A1 | 5/2019 | Kudo et al. | |
| 2020/0152917 | A1 | 5/2020 | Kudo et al. | |
| 2022/0278302 | A1 | 9/2022 | Kudo et al. | |
| 2025/0098471 | A1 * | 3/2025 | Yan | H10K 59/352 |
| 2025/0194359 | A1 * | 6/2025 | Xian | H10K 59/131 |

FOREIGN PATENT DOCUMENTS

| | | | |
|---|---|---|---|
| JP | 2009-230990 | A | 10/2009 |
| JP | 2010-010098 | A | 1/2010 |
| JP | 2011-146375 | A | 7/2011 |
| JP | 2012-253014 | A | 12/2012 |
| JP | 2015-015194 | A | 1/2015 |
| JP | 2015-103406 | A | 6/2015 |
| KR | 10-2012-0019026 | A | 3/2012 |
| KR | 10-2014-0140147 | A | 12/2014 |
| KR | 10-2014-0142627 | A | 12/2014 |
| KR | 10-2016-0014311 | A | 2/2016 |
| KR | 10-2016-0092110 | A | 8/2016 |

OTHER PUBLICATIONS

Korean Intellectual Property Office, Office Action, Korean Patent Application No. 10-2024-0038332, Mar. 27, 2024, 14 pages.

Korean Intellectual Property Office, Office Action, Korean Patent Application No. 10-2016-0079398, Jul. 22, 2024, 16 pages.

* cited by examiner

ELECTROLUMINESCENCE DISPLAY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application *is a reissue of U.S. Pat. No. 10,367,045 issued on Jul. 30, 2019, which was filed as U.S. patent application Ser. No. 16/005,526 on Jun. 11, 2018, which* is a divisional application of U.S. patent application Ser. No. 15/608,734 filed on May 30, 2017, which claims the priority of Republic of Korea Patent Application No. 10-2016-0079398 filed on Jun. 24, 2016, Republic of Korea Patent Application No. 10-2016-0094623 filed on Jul. 26, 2016 and Republic of Korea Patent Application No. 10-2016-0150348 filed on Nov. 11, 2016, with the Korean Intellectual Property Office, all of which are incorporated herein by reference.

BACKGROUND

Field

The present disclosure relates to an electroluminescence display device and more particularly, to an electroluminescence display device capable of reducing reflection of external light, reducing leakage current, improving an aperture ratio, and reducing an image quality defect caused by a light source for fingerprint recognition.

Description of the Related Art

Recently, the field of display for visually displaying electrical information signals has grown rapidly. Thus, various display devices that are thin and light weight, and have low power consumption have been developed.

Specific examples of the display devices include a Liquid Crystal Display (LCD) device, a Plasma Display Panel (PDP) device, a Field Emission Display (FED) device, an Electroluminescence Display Device, and the like.

An electroluminescence display device is a self-light emitting display device. The electroluminescence display device uses an electroluminescence element in which holes and electrons are injected into a light emitting layer from an electrode (anode) for injecting holes and an electrode (cathode) for injecting electrons, respectively, and the holes and electrons are combined into excitons. When the excitons transition from an excited state to a ground state, light is emitted from the electroluminescence element.

The electroluminescence display device can be classified into a top emission type, a bottom emission type, a dual emission type, and the like, depending on a direction of light emission, and can also be classified into a passive matrix type, an active matrix type, and the like, depending on a driving method.

The electroluminescence display device does not need a separate light source unlike an LCD device. Thus, the electroluminescence display device can be manufactured into a thinner form with lighter weight than the LCD device. Further, the electroluminescence display device is advantageous in terms of power consumption since it is driven with a lower voltage than the LCD device. Also, the electroluminescence display device has excellent color expression ability, a high response speed, a wide viewing angle, and a high contrast ratio (CR). Therefore, the electroluminescence display device has been researched as a next-generation display device.

SUMMARY

Embodiments disclosed herein relate to an electroluminescence display device including a thin film transistor, a planarization layer on the thin film transistor, a first bank layer on a surface of the planarization layer facing in a first direction, the thin film transistor disposed between the planarization layer and the first bank layer, the first bank layer having a higher refractive index than the planarization layer, a second bank layer on a surface of the first bank layer facing in the first direction, the second bank layer having a higher refractive index than the first bank layer, and a light emitting layer between a first electrode on the planarization layer and a second electrode on the second bank layer.

In one or more embodiments, the second bank layer includes a black pigment.

In one or more embodiments, the second bank layer includes more black pigments than the first bank layer.

In one or more embodiments, a permittivity of the first bank layer is less than a permittivity of the second bank layer.

In one or more embodiments, a portion of the second bank layer has a smaller width along a second direction perpendicular to the first direction than another portion of the second bank layer. The portion of the second bank layer may be farther away from the first bank layer than said another portion of the second bank layer.

In one or more embodiments, the second bank layer is directly in contact with the first bank layer.

In one or more embodiments, the first bank layer has a thickness D, $D=(2m+1)\lambda/4$, $\lambda$ being a wavelength of light incident on the planarization layer in the first direction, $\lambda$ being 700 nm or more, m being an integer not less than zero. The first bank layer may be configured to absorb a portion of the light corresponding to a wavelength of 700 nm or less.

In one or more embodiments, the electroluminescence display device further includes a spacer on a surface of the second bank layer facing in the first direction. The spacer may include a black pigment.

Embodiments disclosed herein relate to an electroluminescence display device including a first electrode, a second electrode facing the first electrode, an emission layer between the first electrode and the second electrode, and a bank layer defining the emission layer. The bank layer may be disposed between the first electrode and the second electrode. The bank layer may include a first bank layer and a second bank layer. The second bank layer may include a black pigment. The first bank layer may be closer to the first electrode than the second bank layer, and the first bank layer may have a lower permittivity than the second bank layer.

In one or more embodiments, the first bank layer includes the black pigment.

In one or more embodiments, the second bank layer has more black pigments than the first bank layer.

In one or more embodiments, the second bank layer has a higher refractive index than the first bank layer.

In one or more embodiments, the electroluminescence display device further includes a spacer on a surface of the bank layer away from the first electrode. The spacer may be formed of a transparent material or including the black pigment.

Embodiments disclosed herein relate to an electroluminescence display device comprising a thin film transistor on a surface of a substrate facing in a first direction, a planarization layer on the surface of the substrate, the planarization layer covering the thin film transistor, the thin film transistor disposed between the planarization layer and the substrate, the planarization layer having a first area having a first thickness along the first direction and a second area having a second thickness along the first direction, the first thickness smaller than the second thickness, a first electrode on the first area of the planarization layer, the first electrode electrically connected to the thin film transistor, a bank layer on a portion of the second area of the planarization layer, the bank layer including a black pigment, an emission structure including a transport layer and a light emitting layer on a surface of the first electrode facing in the first direction, and a second electrode on a surface of the emission structure facing in the first direction.

In one or more embodiments, at least a part of the first electrode is positioned on an inclined surface of the planarization layer. The inclined surface may be disposed between the first area and the second area of the planarization layer. The inclined surface of the planarization layer may face in a slanted direction from the first direction.

In one or more embodiments, an optical density of the bank layer is 4 or less.

The effects of the present disclosure are not limited to the aforementioned effects, and other effects, which are not mentioned above, will be apparent to a person having ordinary skill in the art from the following description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
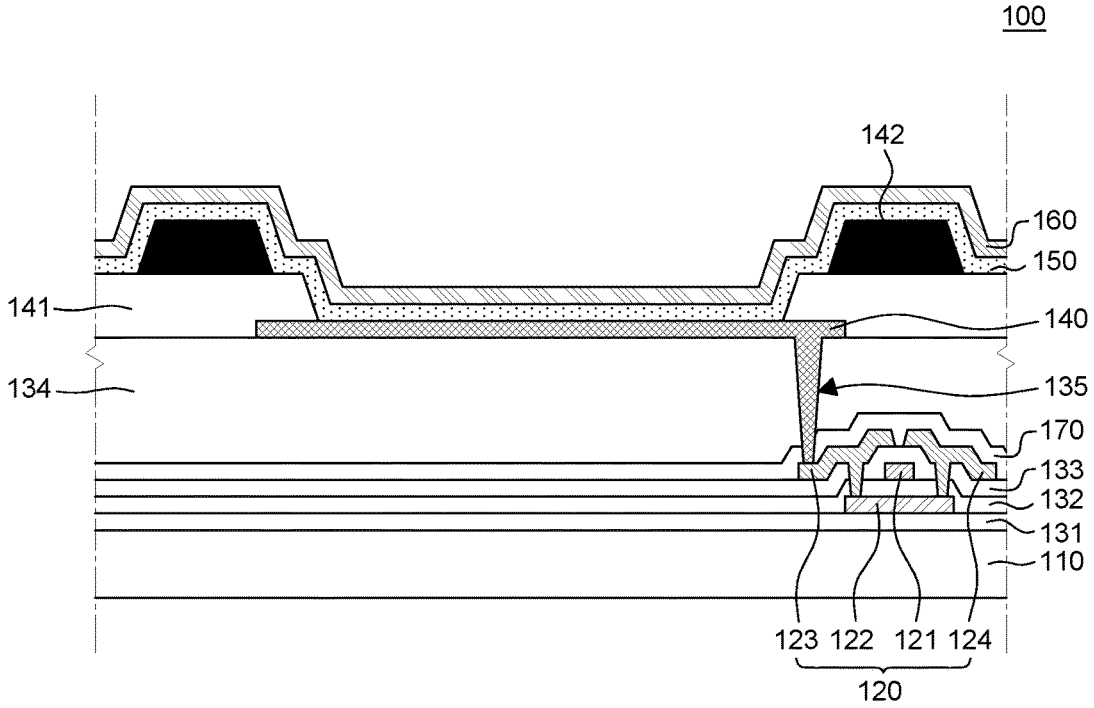
FIG. 1 is a cross-sectional view of an electroluminescence display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but maybe implemented in various different forms. The exemplary embodiments are provided only to complete disclosure of the present disclosure and to fully provide a person having ordinary skill in the art to which the present disclosure pertains with the category of the disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including" and "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts maybe positioned between the two parts unless the terms are used with the term "immediately" or "directly".

When an element or layer is referred to as being "on" another element or layer, it maybe directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

FIG. 1 is a cross-sectional view of an electroluminescence display device according to an exemplary embodiment of the present disclosure.

Referring to FIG. 1, an electroluminescence display device 100 according to an exemplary embodiment of the present disclosure includes a substrate 110, a thin film transistor 120 positioned on the substrate 110, and an emission structure 150. The emission structure 150 is positioned between a first electrode 140 and a second electrode 160 and includes a plurality of transport layer and light emitting layers EML.

The electroluminescence display device 100 includes a plurality of sub-pixels. A sub-pixel refers to an area of a minimum unit for actually emitting light. Further, a plurality of sub-pixels may form a minimum group that can express a white light. For example, three sub-pixels may form a group, and a red sub-pixel, a green sub-pixel, and a blue sub-pixel may form a group. Otherwise, four sub-pixels may form a group, and a red sub-pixel, a green sub-pixel, a blue sub-pixel, and a white sub-pixel may form a group. However, the present disclosure is not limited thereto. It is possible to design sub-pixels in various ways. FIG. 1 illustrates only one sub-pixel from among the plurality of sub-pixels of the electroluminescence display device 100 for convenience in explanation.

The substrate 110 of the electroluminescence display device 100 according to an exemplary embodiment of the present disclosure is configured to support various components of the electroluminescence display device 100 and formed of an insulating material. For example, the substrate 110 may be formed of glass or may be formed as a flexible substrate using a flexible material such as polyethylene terephthalate (PET), polyethylene naphthalate (PEN), and polyimide. Further, if the electroluminescence display device which can be easily implemented into a flexible form is applied to an automotive lighting or an automotive display, various designs and the degree of freedom in design of the automotive lighting can be secured so as to be suitable for a structure or external appearance of a vehicle.

A buffer layer 131 configured to block penetration of impurities from the substrate 110 or the outside and protect various components of the electroluminescence display device 100 may be formed on the substrate 110. The buffer layer 131 may have a single layer or multiple layer structure including, for example, a silicon oxide film (SiOx) or a silicon nitride film (SiNx), but is not limited thereto. The buffer layer 131 may be omitted depending on a structure or characteristics of the electroluminescence display device 100.

The thin film transistor 120 including a semiconductor layer 122, a gate electrode 121, a source electrode 123, and a drain electrode 124 is formed on the buffer layer 131.

Specifically, the semiconductor layer 122 is formed on the substrate 110. A gate insulation layer 132 configured to insulate the semiconductor layer 122 from the gate electrode 121 is formed on the semiconductor layer 122. An interlayer insulation layer 133 configured to insulate the gate electrode 121 from the source electrode 123 and the drain electrode 124 is formed on the gate electrode 121. The source electrode 123 and the drain electrode 124 each of which is in contact with the semiconductor layer 122 are formed on the interlayer insulation layer 133. The source electrode 123 or the drain electrode 124 is electrically connected to the semiconductor layer 122 through a contact hole.

The semiconductor layer 122 may be formed of amorphous silicon (a-Si), polycrystalline silicon (poly-Si), oxide semiconductor, organic semiconductor, or the like. If the semiconductor layer 122 is formed of oxide semiconductor, it may be formed of any one of indium gallium zinc oxide (IGZO), zinc tin oxide (ZTO), indium zinc oxide (IZO), or indium tin zinc oxide (ITZO), but is not limited thereto.

The gate insulation layer 132 may have a single layer or multiple layer structure formed of an inorganic insulating material such as a silicon oxide film (SiO), and a silicon nitride film (SiNx), but is not limited thereto.

The gate electrode 121 functions to transfer a gate signal to the thin film transistor 120, and may be formed of at least one of metals such as aluminum (Al), molybdenum (Mo), titanium (Ti), and copper (Cu) or alloys thereof. The gate electrode 121 may have a single layer or multiple layer structure formed of the metals or alloys thereof, but is not limited thereto.

The source electrode 123 and the drain electrode 124 function to transfer an electrical signal transferred from the outside to the emission structure 150 via the thin film transistor 120. The source electrode 123 and the drain electrode 124 may be formed of at least one of metals such as aluminum (Al), molybdenum (Mo), titanium (Ti), and copper (Cu) or alloys thereof. The source electrode 123 and the drain electrode 124 may have a single layer or multiple layer structure formed of the metals or alloys thereof, but are not limited thereto.

In the present disclosure, the driving thin film transistor 120 electrically connected to the first electrode 140 from among various thin film transistors which can be included in the electroluminescence display device 100 has been illustrated for convenience in explanation. Each sub-pixel may further include a switching thin film transistor or a capacitor.

A passivation layer 170 is formed on the thin film transistor 120. The passivation layer 170 may be formed of an inorganic insulating material. For example, the passivation layer 170 may be formed of a silicon oxide film (SiOx), a silicon nitride film (SiNx), or the like, but is not limited thereto. The passivation layer 170 may be omitted on a structure or characteristics of the electroluminescence display device 100.

A planarization layer 134 is formed on the passivation layer 170. The planarization layer 134 functions to flatten components such as the thin film transistor 120 on the substrate 110. The planarization layer 134 maybe configured as a single layer or a plurality of layers, and may be formed of an organic material. For example, the planarization layer 134 may be formed of polyimide, photo acryl, or benzocyclobutene (BCB), but is not limited thereto.

The passivation layer 170 and the planarization layer 134 include a contact hole 135 for electrically connecting the thin film transistor 120 and the first electrode 140 in each sub-pixel.

The first electrode 140 is formed on the planarization layer 134. The first electrode 140 may be an anode and may be formed of a conductive material having a relatively high work function value. Thus, the first electrode 140 functions to supply holes to a transport layer of the emission structure 150. The first electrode 140 is electrically connected to the thin film transistor 120 through the contact hole 135 formed in the passivation layer 170 and the planarization layer 134. For example, the first electrode 140 may be electrically connected to the source electrode 123 of the thin film transistor 120. Further, the first electrodes 140 of different subpixels are spaced apart from each other. The first electrode 140 is formed of a transparent conductive material, and may be formed of, for example, indium tin oxide (ITO), indium zinc oxide (IZO), and the like, but is not limited thereto.

If the electroluminescence display device 100 according to an exemplary embodiment of the present disclosure is of a top-emission type, light emitted from the light emitting layer of the emission structure 150 is reflected by the first electrode 140. In this case, a reflective layer formed of a metal material, for example, aluminum (Al) or silver (Ag), having a high reflection efficiency may be further formed on an upper or lower part of the first electrode 140 in order for the light to be more readily released in an upward direction.

For example, the first electrode 140 may have a two-layer structure in which a transparent conductive layer formed of a transparent conductive material and a reflective layer are laminated in sequence. Otherwise, the first electrode 140 may have a three-layer structure in which a transparent conductive layer, a reflective layer, and a transparent conductive layer are laminated in sequence. The reflective layer may be formed of silver (Ag) or an alloy including silver. For example, the reflective layer may be formed of silver (Ag) or APC (Ag/Pd/Cu).

In the electroluminescence display device 100 according to an exemplary embodiment of the present disclosure, the top-emission type refers to a structure in which light emitted from the light emitting layer of the emission structure 150 is output in a direction toward the second electrode 160. A bottom-emission type refers to a structure in which the light is output in a direction toward the first electrode 140 on the contrary to the top-emission type.

The emission structure 150 is formed on the first electrode 140, a first bank layer 141, and a second bank layer 142. The emission structure 150 may include various transport layers as necessary, and essentially includes the light emitting layer EML. The light emitting layer may include an organic material, but is not limited thereto. Further, the emission structure 150 may include a plurality of light emitting layers depending on a structure of the electroluminescence display device. The transport layers may include at least one hole transport layer HTL and one electron transport layer ETL, and may further include functional layers such as a hole injection layer HIL, an electron injection layer EIL, a hole blocking layer HBL, and an electron blocking layer EBL. Further, the plurality of transport layers included in the emission structure 150 may have a common layer structure so as to correspond to a red sub-pixel R, a green sub-pixel G, and a blue sub-pixel B.

The second electrode 160 is formed on the emission structure 150. The second electrode 160 may be a cathode and supply electrons to the light emitting layer of the emission structure. Thus, the second electrode 160 is formed of a conductive material having a low work function. More specifically, the second electrode 160 may be formed of a metal material such as magnesium (Mg), and silver-magnesium (Ag:Mg), but is not limited thereto.

If the electroluminescence display device 100 according to an exemplary embodiment of the present disclosure is of the top-emission type, the second electrode 160 may be formed of transparent conductive oxide such as indium tin oxide (ITO), indium zinc oxide (IZO), indium tin zinc oxide (ITZO), zinc oxide (ZnO), and tin oxide (TiO), but is not limited thereto.

Figure 2:
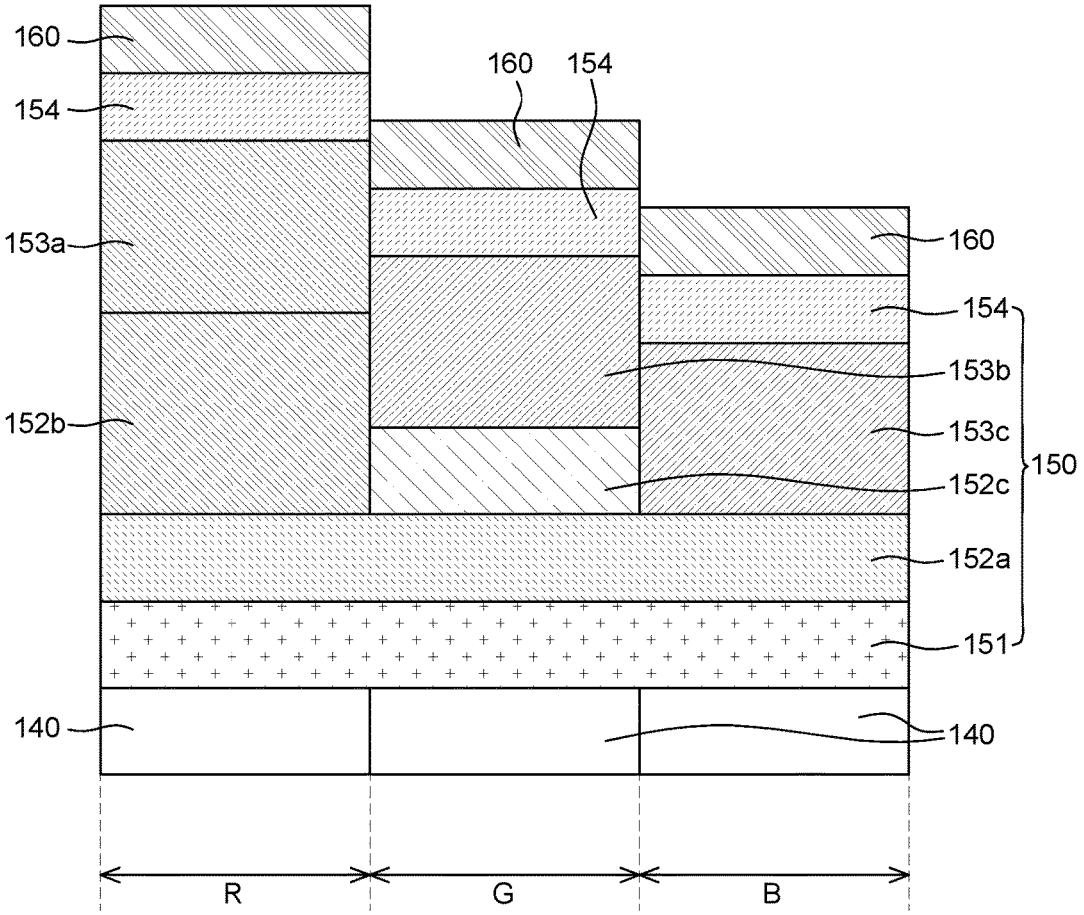
FIG. 2 is a cross-sectional view of an emission structure of an electroluminescence display device according to an exemplary embodiment of the present disclosure.

FIG. 2 is a cross-sectional view of an emission structure of an electroluminescence display device according to an exemplary embodiment of the present disclosure.

Hereinafter, the emission structure 150 of the electroluminescence display device 100 according to an exemplary embodiment of the present disclosure will be described in more detail with reference to FIG. 2.

Referring to FIG. 2, the emission structure 150 of the electroluminescence display device 100 according to an exemplary embodiment of the present disclosure includes a hole injection layer (HIL) 151, a first hole transport layer (1st HTL) 152a on the HIL 151, a second hole transport layer (2nd HTL) 152b and a third hole transport layer (3rd HTL) on the 1st HTL 152a, an organic light emitting layer EML including a red light emitting layer 153a, a green light emitting layer 153b, and a blue light emitting layer 153c disposed on the HTLs 152a, 152b, and 152c, and an electron transport layer (ETL) 154 on the EML.

The first electrode 140 is disposed on the planarization layer 134 so as to correspond to each of a red sub-pixel area R, a green sub-pixel area G, and a blue sub-pixel area B defined on the substrate.

The HIL 151 is disposed on the first electrode 140 as a common layer corresponding to the red sub-pixel area R, the green sub-pixel area G, and the blue sub-pixel area B.

The HIL 151 may function to facilitate injection of holes, and may be formed of at least one of HATCN (1,4,5,8,9,11-hexaazatriphenylene-hexanitrile), CuPc (copper phthalocyanine), PEDOT(poly(3,4)-ethylenedioxythiophene), PANI (polyaniline) and NPD(N,N-dinaphthyl-N,N'-diphenylbenzidine), TPD(N,N'-Bis(3-methylphenyl)-N,N"-bis(phenyl)-benzidine), α-NPB(Bis[N-(1-naphthyl)-N-phenyl]benzidine), TDAPB(1,3,5-tris(4-diphenylaminophenyl)benzene), TCTA(Tris(4-carbazoyl-9-yl)triphenylamine), spiro-TAD(2,2',7,7"-Tetrakis(N,N-diphenylamino)-9,9-spirobifluorene) and CBP(4,4'-bis(carbazol-9-yl)biphenyl), but is not limited thereto.

The HIL 151 may be formed by doping a material of the 1st HTL 152a with a p-dopant. In this case, the HIL 151 and the 2nd HTL 152b can be formed in a single processing device through a continuous process. The p-dopant may be formed of $F_4$-TCNQ (2,3,5,6-tetrafluoro-7,7,8,8-tetracyanoquinidimethane), but is not limited thereto.

The 1st HTL 152a is disposed on the HIL 151 as a common layer corresponding to the red sub-pixel area R, the green sub-pixel area G, and the blue sub-pixel area B. The 1st HTL 152a functions to facilitate transport of holes, and may be formed of any one or more of NPD(N,N-dinaphthyl-N,N'-diphenylbenzidine), TPD(N,N'-bis-(3-methylphenyl)-N,N'-bis-(phenyl)-benzidine), spiro-TAD(2,2',7,7"-Tetrakis(N,N-diphenylamino)-9,9-spirobifluorene) and MTDATA (4,4',4"-Tris(N-3-methylphenyl-N-phenyl-amino)-triphenylamine), but is not limited thereto.

The 2nd HTL 152b is disposed on the 1st HTL 152a in the red sub-pixel area R. Further, the 3rd HTL 152c is disposed on the 1st HTL 152a in the green sub-pixel area G.

The 2nd HTL 152b and the 3rd HTL 152c function to facilitate transport of holes from the HIL 151 to the red light emitting layer 153a and the green light emitting layer 153b, respectively.

Further, a thickness of each of the 2nd HTL 152b and the 3rd HTL 152c may form an optical distance of micro cavity. More specifically, the thickness of each of the 2nd HTL 152b and the 3rd HTL 152c may be determined such that the red light emitting layer 153a forms a micro cavity structure between the first electrode 140 and the second electrode 160 and the green light emitting layer 153b forms a micro cavity structure between the first electrode 140 and the second electrode 160. The optical distance of the micro cavity is formed in the red sub-pixel area R and the green sub-pixel area G, so that the efficiency of the electroluminescence display device 100 can be improved.

The red light emitting layer 153a is disposed on the 2nd HTL 152b in the red sub-pixel area R. The red light emitting layer 153a may include a light emitting material that emits a red light. The light emitting material may be formed using a phosphorescent material or a fluorescent material.

More specifically, the red light emitting layer 153a may include a host material including CBP (carbazole biphenyl) or mCP (1,3-bis(carbazol-9-yl)benzene), and may be formed of a phosphorescent material including any one or more dopants from among $Ir(btp)_2(acac)$ (bis(2-benzo[b]thiophen-2-yl-pyridine) (acetyl acetonate)iridium(III)), $Ir(piq)_2(acac)$ (bis(1-phenylisoquinoline) (acetylacetonate)iridium(III)), $Ir(piq)_3$(tris (1-phenylquinoline)iridium(III)), and PtOEP(octaethylporphyrin platinum). Otherwise, the red light emitting layer 153a may be formed of a fluorescent material including PBD:Eu(DBM)3(Phen) or perylene, but is not limited thereto.

The green light emitting layer 153b is disposed on the 3rd HTL 152c in the green sub-pixel area G. The green light emitting layer 153b may include a light emitting material that emits a green light. The light emitting material maybe formed using a phosphorescent material or a fluorescent material.

More specifically, the green light emitting layer 153b may include a host material including CBP or mCP, and may be formed of a phosphorescent material including a dopant material such as an iridium (Ir) complex including $Ir(ppy)_3$(tris(2-phenylpyridine)iridium(III)) or $Ir(ppy)_2$ (acaa) (bis(2-phenylpyridine) (acetylacetonate)iridium(III). Otherwise, the green light emitting layer 153b may be formed of a fluorescent material including $Alq_3$(tris(8-hydroxyquinolino) aluminum), but is not limited thereto.

The blue light emitting layer 153c is disposed on the 1st HTL 152a in the blue sub-pixel area B. The blue light emitting layer 153c may include a light emitting material that emits a blue light. The light emitting material may be formed using a phosphorescent material or a fluorescent material.

More specifically, the blue light emitting layer 153c may include a host material including CBP or mCP, and may be formed of a phosphorescent material including a dopant material including FIrPic(bis(3,5,-difluoro-2-(2-pyridyl)phenyl-(2-carboxy-pyridyl)iridium(III)). Further, the blue light emitting layer 153c may be formed of a fluorescent material including any one of DPVBi(4,4'-bis[4-di-p-tolylamino)styryl)biphenyl), DSA(1-4-di-[4-(N,N-di-phenyl)amino]styryl-benzene), a PFO(polyfluorene)-based polymer, a PPV(polyphenylenevinylene)-based polymer, but is not limited thereto.

The ETL 154 is disposed on each of the red light emitting layer 153a, the green light emitting layer 153b, and the blue light emitting layer 153c so as to correspond to the red sub-pixel area R, the green sub-pixel area G, and the blue sub-pixel area B.

The ETL 154 may function to transport and inject electrons. A thickness of the ETL 154 may be adjusted considering electron transport properties.

The ETL 154 functions to facilitate transport of electrons, and may be formed of any one or more of Liq(8-hydroxyquinolinolato-lithium), $Alq_3$(tris (8-hydroxyquinolinato) aluminum), PBD(2-(4-biphenylyl)-5-(4-tert-butylpheny)-1,3,4oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato) aluminum), but is not limited thereto.

Further, an electron injection layer (EIL) can be further provided on the ETL 154.

The EIL may be formed of an inorganic metal compound such as $BaF_2$, LiF, NaCl, CsF, $Li_2O$, and BaO, but is not limited thereto.

Herein, the structure is not limited according to an exemplary embodiment of the present discourse. At least any one of the HIL 151, the 1st HTL 152a, the 2nd HTL 152b, the 3rd HTL 153c, and the ETL 154 may be omitted. Further, any one of the HIL 151, the 1st HTL 152a, the 2nd HTL 152b, the 3rd HTL 153c, and the ETL 154 may be formed as two or more layers.

The second electrode 160 is disposed on the ETL 154 so as to correspond to the red sub-pixel area R, the green sub-pixel area G, and the blue sub-pixel area B.

A capping layer may be disposed on the second electrode 160. The capping layer functions to improve the light extraction effect of the electroluminescence display device. The capping layer may be formed of any one of host materials of the 1st HTL 152a, the ETL 154, the red light emitting layer 153a, the green light emitting layer 153b, and the blue light emitting layer 153c. Further, the capping layer may be omitted depending on a structure or characteristics of the electroluminescence display device 100.

The EML 153 of the electroluminescence display device 100 according to an exemplary embodiment of the present disclosure maybe formed including at least one phosphorescent material. More specifically, the EML 153 may include the red light emitting layer 153a for emitting a red light in the red sub-pixel R, the green light emitting layer 153b for emitting a green light in the green sub-pixel G, and the blue light emitting layer 153c for emitting a blue light in the blue sub-pixel B. In this case, the red light emitting layer 153a may include a phosphorescent material and the green light emitting layer 153b and the blue light emitting layer 153c may include a fluorescent material. Otherwise, the red light emitting layer 153a and the green light emitting layer 153b may include a phosphorescent material and the blue light emitting layer 153c may include a fluorescent material. Alternatively, the red light emitting layer 153a, the green light emitting layer 153b, and the blue light emitting layer 153c may include a phosphorescent material.

Further, the electroluminescence display device 100 according to an exemplary embodiment of the present disclosure may be applied to various display devices including a TV, a mobile, a tablet PC, a monitor, a laptop computer, an automotive display, and an automotive lighting. Further, the electroluminescence display device 100 may also be applied to a wearable display device, a foldable display device, a bendable display device, a rollable display device, and the like.

Figure 3:
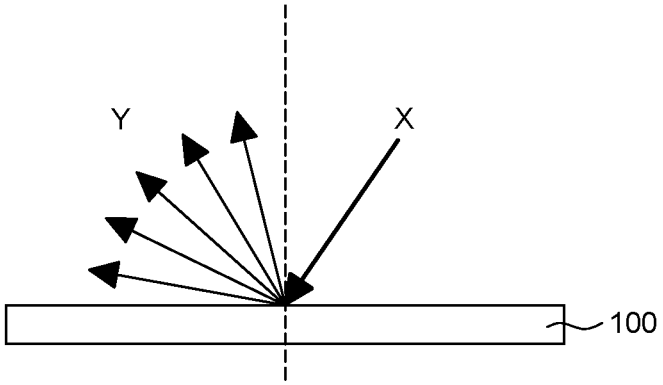
FIG. 3 is a diagram illustrating a method of measuring a reflection luminance of an electroluminescence display device according to an exemplary embodiment of the present disclosure.

FIG. 3 is a diagram illustrating a method of measuring a reflection luminance of an electroluminescence display device according to an exemplary embodiment of the present disclosure.

In one example, a reflection luminance is measured by the luminance of light reflected at a reflection angle of 30 degrees from among many reflected beams of light Y when light of 400 Knit (an incident light denoted as "X" in FIG. 2) is incident into the electroluminescence display device 100 at an angle of 45 degrees. The reflection luminance maybe measured using a DMS803. The reflection luminance of the electroluminescence display device 100 illustrated in FIG. 1 was measured using this apparatus, and will be described as an example. The reflection luminance is 300 nit or more at a reflection angle of 30 degrees when light of 400 Knit is incident at an incident angle of 45 degrees. If the reflection luminance is 300 nit or more, a visual sensitivity in the left and right directions of the electroluminescence display device 100 may be decreased due to reflection of external light. Therefore, in order to reduce reflection of the external light by the electroluminescence display device 100, the bank layers 141 and 142 may be formed of a material that does not reflect light incident from the outside.

In one aspect, the bank layers include a black pigment in order to reduce reflection of external light. However, if the bank layers are formed of the material including the black pigment, an optical density (OD) may increase. If the OD is increased, a permittivity of the bank layers is increased, which may cause leakage current of the electroluminescence display device. Advantageously, an electroluminescence display device disclosed herein can reduce leakage current even when the OD is increased and also reduce reflection of external light.

Referring to FIG. 1 again, the bank layers 141 and 142 can define the sub-pixels and may include at least two layers. That is, the first bank layer 141 may be more adjacent to the first electrode 140 than a second bank layer 142, and the second bank layer 142 may be more adjacent to the second electrode 160 than the first bank layer 141. Further, the first bank layer 141 and the second bank layer 142 expose a part of an upper surface of the first electrode 140. Specifically, as illustrated in FIG. 3, the first bank layer 141 and the second bank layer 142 may be disposed to cover an edge of the first electrode 140.

Further, the first bank layer 141 may have a greater width than the second bank layer 142 in order to secure a margin caused by the formation of the second bank layer 142 of an organic material. In other words, an open portion of the second bank layer 142 may have a greater width than an open portion of the first bank layer 141, but is not limited thereto.

The second bank layer 142 may be formed by a photolithography process. That is, a photoresist maybe formed on the first electrode 140 to form the bank layers 141 and 142 and then, the second bank layer 142 may be formed by the photolithography process.

The photoresist refers to a photosensitive resin which is changed in solubility to a developer by action of light and thus makes it possible to obtain a pattern. The photoresist can be classified into a positive photoresist and a negative photoresist. With the positive photoresist, a light exposure part is increased in solubility to a developer and then the light exposure part is removed during a developing process, so that a pattern can be obtained. Further, with the negative photoresist, a light exposure part is decreased in solubility to a developer and then a non-light exposure part is removed during a developing process, so that a pattern can be obtained.

In order to reduce reflection of external light by the electroluminescence display device 100, the second bank layer 142 is formed of a material that reduces reflection of external light. Therefore, a photoresist for forming the second bank layer 142 may include a black pigment. The black pigment may be formed of an organic material or an inorganic material. Further, the black pigment may be formed of a carbon-based material, metal oxide, or the like. Further, the photoresist may include photosensitive compounds including at least one of a polymer, a monomer, and a photoinitiator. Furthermore, the photoresist may include a solvent that disperses the photosensitive compounds.

According to reaction mechanism, the black pigment in the photoresist is dispersed in the photosensitive compounds by the solvent before exposure. The solvent of the photoresist can be removed by a vacuum drying process or a curing process. Further, the photoinitiator included in the photosensitive compounds generates radicals by light after exposure. Then, the monomer included in the photoresist has a double bond and thus reacts with the radicals of the photoinitiator so as to form cross-linking. Therefore, the photoresist has a high molecular weight after exposure and thus is not dissolved by the developer. Then, during a subsequent developing process using the developer, a part which is not dissolved by the developer becomes the second bank layer 142 and a part which is dissolved by the developer is removed. Therefore, the photoresist included in the second bank layer 142 may be referred to as a negative photoresist.

Further, the photoinitiator included in the photoresist may include an imine-based photoinitiator to improve cross-linking after exposure. For example, the imine-based photoinitiator may include at least one of oxime and oxime ester.

In this case, oxime or oxime ester is a photoinitiator having a long wavelength and capable of improving cross-linking. Herein, the long wavelength refers to 365 nm or more. Further, a light source used for exposure is a high-pressure mercury lamp having various wavelengths. The various wavelengths may include G-line of 436 nm, H-line of 405 nm, and I-line of 365 nm. Particularly, the I-line of 365 nm or more is used to perform a photolithography process.

Further, oxime or oxime ester can reduce the generation of a by-product of exposure. Therefore, in a baking process as a subsequent process of the cross-linking, impurities caused by a reaction between the by-product and other molecules can be reduced. Further, oxime or oxime ester is used together with the black pigment. Therefore, the second bank layer 142 having a high light-shielding property can be formed. Otherwise, acetophenone may be further included in the photoinitiator in addition to oxime or oxime ester.

For example, oxime may be represented by the following Chemical Formula 1.

[Chemical Formula 1]

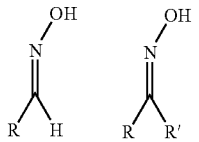

Herein, R and R' may be one of an alkyl group or a phenyl group having 1 to 15 carbon atoms.

For example, oxime ester may be represented by the following Chemical Formula 2.

[Chemical Formula 2]

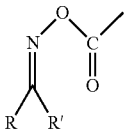

Herein, R may be an aryl group and R' may be one of an alkyl group or a phenyl group having 1 to 15 carbon atoms.

The monomer may include 6 functional groups, and may include, for example, dipentaerythritol hexaacrylate (DPHA). Herein, DPHA has a double bond and can be quickly cured by light after the cross-linking. Therefore, the photoresist for forming the second bank layer 142 may be formed as a solid film with an improved anti-developing property. Thus, even in a developing process using a high-concentration developer, the film may not be lost.

Further, the polymer in the photoresist includes a cardo-based polymer. The cardo-based polymer has an excellent heat resistance and miscibility with a pigment and also has an excellent solubility. Also, the polymer in the photoresist may further include epoxy acrylate. Therefore, the polymer in the photoresist including the cardo-based polymer or epoxy acrylate functions to disperse the black pigment in the polymer and thus improves the dispersibility. The dispersibility refers to uniformity of the photoresist. As the dispersibility is increased, the second bank layer 142 can be formed in a uniform manner.

For example, the cardo-based polymer may be represented by the following Chemical Formula 3.

[Chemical Formula 3]

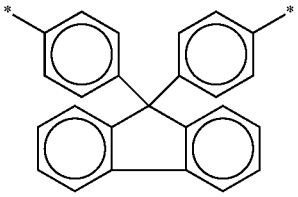

Further, the developer may be, for example, TMAH (tetramethylammoniumhydroxide) or KOH (potassium hydroxide).

Furthermore, since the second bank layer 142 includes the black pigment, an optical density which is the degree of shielding of light may be increased. As the optical density is increased, reflection of external light can be reduced. However, if the optical density is increased, a permittivity is increased, so that leakage current may be generated.

The leakage current refers to current flowing to an unintended sub-pixel adjacent to a target sub-pixel through a transport layer such as the hole injection layer or the hole transport layer, when another current is applied to drive the target sub-pixel. Since the unintended sub-pixel emits light, the leakage current causes color mixing of light output from two adjacent sub-pixels and causes a decrease in luminance.

Therefore, the first bank layer 141 is formed of a material with a low permittivity in order to reduce a permittivity of the second bank layer 142 and to reduce the leakage current. That is, the bank layers 141 and 142 may include at least two layers. Further, the first bank layer 141 maybe more adjacent to the first electrode 140 than the second bank layer 142, and the second bank layer 142 may be more adjacent to the second electrode 160 than the first bank layer 141. Therefore, the first bank layer 141 adjacent to the first electrode 140 may be formed of a material with a permittivity of 7 $C/m^2$ ($Coulomb/m^2$) or less, and may be formed of an organic material or an inorganic material. For example, the first bank layer 141 maybe formed of one of polyimide, silicon oxide (SiOx), and silicon nitride (SiNx), but is not limited thereto.

Therefore, the first bank layer 141 adjacent to the first electrode 140 is formed of a material with a lower permittivity than the second bank layer 142 adjacent to the second electrode 160. Thus, an optical density of the second bank layer is increased due to the black pigment included in the second bank layer 142. Therefore, even if a permittivity is increased due to the second bank layer including the black pigment, the total permittivity of the first bank layer 141 and the second bank layer 142 may be decreased. That is, the first bank layer 141 can reduce leakage current caused by an increase in permittivity of the second bank layer 142 and also suppress color mixing or a decrease in luminance between sub-pixels due to the leakage current.

Since the second bank layer 142 is formed of a material including the black pigment, when an incident angle of an incident light is 45 degrees, a reflection luminance at a reflection angle of 30 degrees may be set to 30 nit or less. Therefore, reflection of external light can be improved and the reflection luminance can be decreased. A reflection luminance of the second bank layer 142 may be measured using a DMS803. Herein, the reflection luminance may include reflection luminance on the left and right of the electroluminescence display device 100. That is, when an incident angle of an incident light is 45 degrees, the left and right reflection luminance may be 30 nit or less at a reflection angle of 30 degrees. Further, if the electroluminescence display device 100 is applied to an automotive display, a display device with reduced reflection of external light can be provided. Furthermore, since reflection of external light can be reduced by the electroluminescence display device 100, a visual sensitivity, for example, in the left and right directions of the electroluminescence display device 100 can be improved.

Therefore, the first bank layer 141 is formed of a material with a low permittivity and the second bank layer 142 is formed of a material including the black pigment. Thus, it is possible to provide the electroluminescence display device 100 in which the bank layer has an improved optical density with reduced leakage current. That is, it is possible to provide the electroluminescence display device 100 in which leakage current can be reduced by the first bank layer 141 and reflection of external light can be minimized by the second bank layer 142.

The first bank layer 141 may be formed of the same material as the second bank layer 142. That is, the first bank layer 141 may be formed of the same material as the second bank layer 142 but a weight % (wt %) of a black pigment included in each of the first bank layer 141 and the second bank layer 142 may be different from each other. Therefore, a weight % (wt %) of a black pigment included in the first bank layer 141 may be set to be smaller than that of a black pigment included in second bank layer 142 so as to suppress an increase in permittivity. For example, the amount of a black pigment included in the first bank layer 141 may be set to about 20 weight % (wt o) or less and the amount of a black pigment included in the second bank layer 142 may be set to about 40 weight % (wt %) or less, but are not limited thereto. In this case, the amount of a black pigment may be a weight % (wt %) of a black pigment with respect to 100 weight % (wt o) of a photoresist for forming the first bank layer 141 or the second bank layer 142. Further, a permittivity of the first bank layer 141 may be 7 $C/m^2$ or less and a permittivity of the second bank layer 142 may be 10 $C/m^2$ or less.

Therefore, even if the first bank layer 141 and the second bank layer 142 are formed of the same material, the total permittivity of the first bank layer 141 and the second bank layer 142 can be reduced by adjusting a weight % (wt %) of the black pigment. That is, it is possible to reduce leakage current caused by an increase in permittivity and also possible to suppress color mixing or a decrease in luminance of light output from adjacent sub-pixels due to the leakage current.

Figure 4:
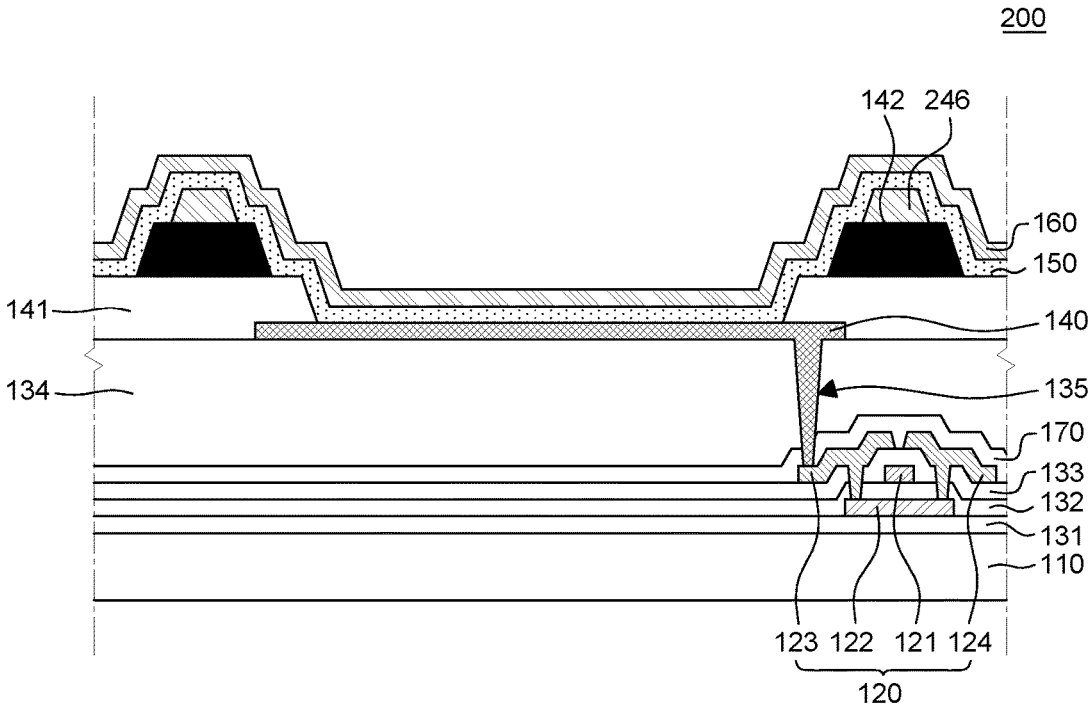
FIG. 4 is a cross-sectional view of an electroluminescence display device according to another exemplary embodiment of the present disclosure.

FIG. 4 is a cross-sectional view of an electroluminescence display device according to another exemplary embodiment of the present disclosure.

In explaining an electroluminescence display device 200 according to another exemplary embodiment of the present disclosure, detailed description of components identical or corresponding to those of the above-described exemplary embodiment will be omitted or briefly provided.

A spacer 246 may suppress a defect caused by a contact with a mask when a plurality of transport layers or light emitting layers EML is formed on the emission structure 150 or the second electrode 160 is formed on the emission structure 150.

The spacer 246 is disposed on a partial area of the second bank layer 142 adjacent to the second electrode 160, and may be formed on an area other than sub-pixels of the electroluminescence display device 200. That is, the spacer 246 may be disposed on a non-pixel area. The non-pixel area maybe an area other than an emission area. The spacer 246 may be formed of one of polyimide, photo acryl, and benzocyclobutene (BCB) which are transparent materials.

Even if the second bank layer 142 is formed of a material including the black pigment, reflection of external light by the second bank layer 142 may be reduced, since the spacer 246 formed of a transparent material causes scattering of light. Further, if the second bank layer 142 and the spacer 246 are respectively formed of different materials, a photolithography process maybe performed two times. Thus, the number of processes may be increased.

Therefore, the spacer 246 may be formed of the same material as the second bank layer 142 in order to reduce reflection and scattering of external light and scattering and simplify the manufacturing process of the electroluminescence display device 200. A photoresist for forming the spacer 246 includes a black pigment. Further, the photoresist for forming the spacer 246 may include photosensitive compounds including at least one of a polymer, a monomer, and a photoinitiator. The polymer in the photoresist may include at least one of a cardo-based polymer and epoxy acrylate. Further, the monomer in the photoresist may include 6 functional groups, and may include, for example, dipentaerythritol hexaacrylate (DPHA). Also, the photoinitiator in the photoresist may include at least one of oxime and oxime ester, and may also include a solvent that disperses the photosensitive compounds.

Since the spacer 246 is formed of the same material as the second bank layer 142 and the second bank layer 142 and the spacer 246 can be formed by the same photolithography process, the manufacturing process can be simplified. That is, since the second bank layer 142 and the spacer 246 can be formed by a halftone process using a halftone mask, the manufacturing process can be simplified. Details thereof will be described below with reference to FIG. 5A and FIG. 5B.

Figure 5A:
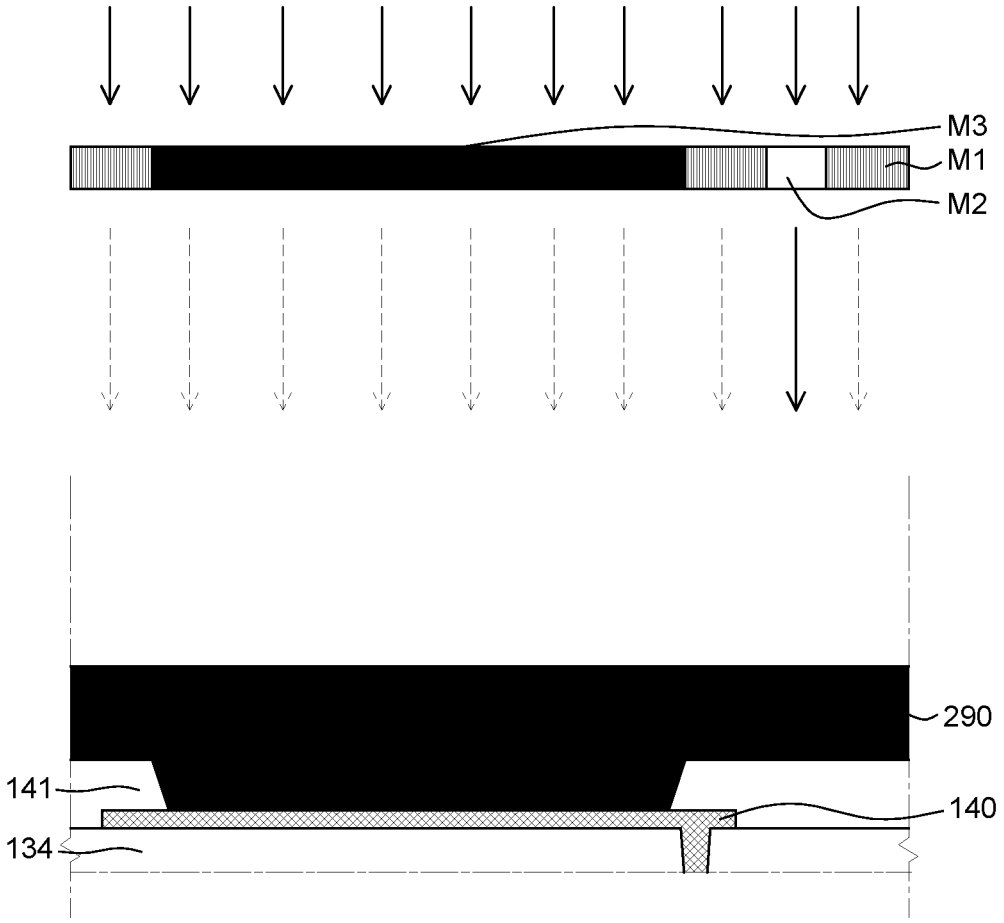
FIG. 5A and FIG. 5B are diagrams provided to explain a method of manufacturing an electroluminescence display device according to another exemplary embodiment of the present disclosure.
Figure 5B:
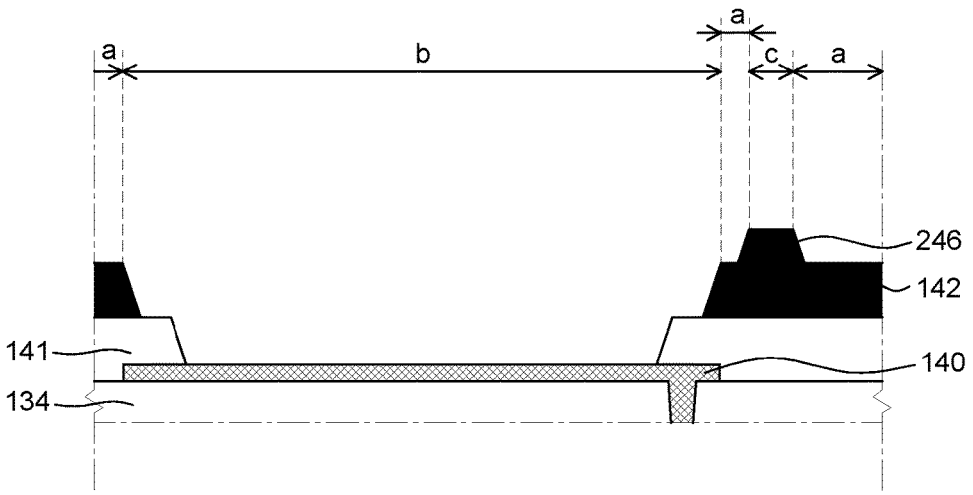

FIG. 5A and FIG. 5B are diagrams provided to explain a method of manufacturing an electroluminescence display device according to another exemplary embodiment of the present disclosure.

As illustrated in FIG. 5A and FIG. 5B, a photoresist 290 including a black pigment is formed on the first bank layer 141. The photoresist may include photosensitive compounds including at least one of a polymer, a monomer, and a photoinitiator. Further, the photoresist may also include a solvent that disperses the photosensitive compounds. The polymer in the photoresist may include at least one of a cardo-based polymer and epoxy acrylate. Further, the monomer in the photoresist may include 6 functional groups, and may include, for example, dipentaerythritol hexaacrylate (DPHA). Also, the photoinitiator in the photoresist may include one of oxime and oxime ester. Furthermore, the solvent of the photoresist may be propylene glycol monomethyl ether acetate (PGMEA).

Before an exposure process, the solvent of the photoresist maybe removed by a vacuum drying process or a curing process. Then, a mask is disposed on the photoresist 290 and an exposure process which is a photolithography process and a developing process are performed. The mask is a halftone mask with different light transmittances. That is, the mask includes a transflective region M1, a transmission region M2, and a shielding region M3. The photoresist 290 corresponding to the transflective region M1 is formed as the second bank layer 142 in a first area a. Further, the photoresist 290 corresponding to the transmission region M2 is formed as the spacer 246 on the second bank layer 142 in a third area c. The shielding region M3 of the mask refers to a region that shields light, and exposes a part of the first electrode 140 and the first bank layer 141 in a second area b through a developing process. A width of an upper surface of the first bank layer 141 may be greater than a width of a lower surface of the second bank layer 142, but is not limited thereto. Specifically, the photoresist in the transflective region M1 and the transmission region M2 exposed to light through the mask is converted into a polymer cross-linked by light and thus does not react with a developer. The photoresist in the shielding region M3 which is not exposed to light is removed by reaction with the developer. Therefore, the emission structure 150 may be formed in the second area b. After the developing process, a baking process (e.g., a heating process) may be performed to form the second bank layer 142 and the spacer 246. That is, the second bank layer 142 may be formed and the spacer 246 may also be formed on the partial area of the second bank layer 142 adjacent to the second electrode 160.

Further, as illustrated in FIG. 4, the emission structure 150 may be formed on a partial area of the first electrode 140, the second bank layer 142, and the spacer 246. Also, the second electrode 160 may be formed on the emission structure 150.

Further, since the second bank layer 142 and the spacer 246 include the black pigment, light is absorbed during the exposure process. Therefore, it is difficult to apply the halftone process thereto. In order to solve this problem, the amount of exposure maybe increased during the exposure process. For example, the amount of exposure may be in the range of from 40 mJ to 100 mJ.

Figure 6A:
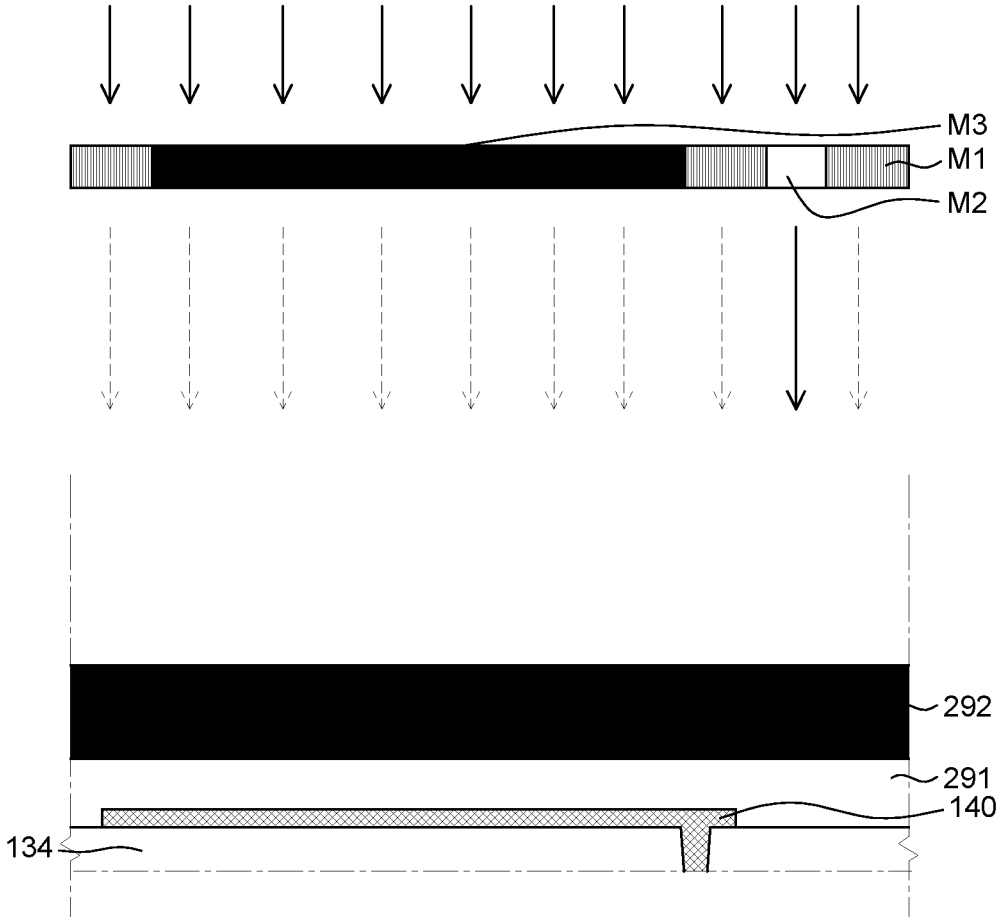
FIG. 6A and FIG. 6B are diagrams provided to explain a method of manufacturing an electroluminescence display device according to yet another exemplary embodiment of the present disclosure.
Figure 6B:
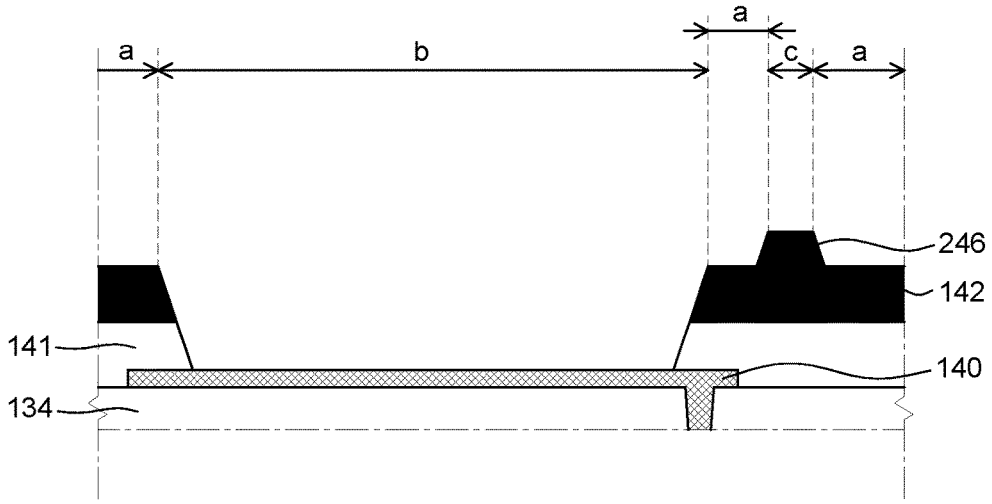

FIG. 6A and FIG. 6B are diagrams provided to explain a method of manufacturing an electroluminescence display device according to yet another exemplary embodiment of the present disclosure.

FIG. 6A and FIG. 6B are diagrams provided to explain a process of manufacturing the first bank layer 141, the second bank layer 142, and the spacer 246 by the same process such as the halftone process. Further, an electroluminescence display device manufactured as illustrated in FIG. 6A and FIG. 6B may have the same configuration as the electroluminescence display device illustrated in FIG. 4. Therefore, an explanation thereof will be omitted.

As illustrated in FIG. 6A and FIG. 6B, a first photoresist 291 including a black pigment is formed on the first electrode 140. A second photoresist 292 including a black pigment is formed on the first photoresist 291. The first photoresist 291 and the second photoresist 292 may include photosensitive compounds including at least one of a polymer, a monomer, and a photoinitiator. Further, the first photoresist 291 and the second photoresist 292 may also include a solvent that disperses the photosensitive compounds. The polymer in the first photoresist 291 and the second photoresist 292 may include at least one of a cardo-based polymer and epoxy acrylate. Further, the monomer in the first photoresist 291 and the second photoresist 292 may include 6 functional groups, and may include, for example, dipentaerythritol hexaacrylate (DPHA). Also, the photoinitiator in the first photoresist 291 and the second photoresist 292 may include at least one of oxime and oxime ester. Furthermore, the solvent of the photoresist may be propylene glycol monomethyl ether acetate (PGMEA).

Further, a weight % (wt %) of a black pigment included in each of the first photoresist 291 and the second photoresist 292 may be different from each other. For example, the amount of a black pigment included in the first photoresist 291 may be set to about 20 weight % (wt %) or less and the amount of a black pigment included in the second photoresist 292 maybe set to about 40 weight % (wt %) or less, but are not limited thereto. In this case, the amount of a black pigment may be a weight % (wt %) of a black pigment with respect to 100 weight % (wt %) of the first photoresist 291 and the second photoresist 292.

Before an exposure process, the solvent of the first photoresist 291 and the second photoresist 292 may be removed by a vacuum drying process or a curing process. Then, a mask is disposed on the first photoresist 291 and the second photoresist 292 and an exposure process which is a photolithography process and a developing process are performed. The mask is a halftone mask with different light transmittances. That is, the mask includes the transflective region M1, the transmission region M2, and the shielding region M3. The first photoresist 291 and the second photoresist 292 corresponding to the transflective region M1 is formed as the first bank layer 141 and the second bank layer 142 in the first area a. Further, the second photoresist 292 corresponding to the transmission region M2 is formed as the spacer 246 on the second bank layer 142 in the third area c. The shielding region M3 of the mask refers to a region that shields light, and exposes the first electrode 140 in the second area b through a developing process. A width of an upper surface of the first bank layer 141 may be the same as a width of a lower surface of the second bank layer 142, but is not limited thereto. Specifically, the photoresist in the transflective region M1 and the transmission region M2 exposed to light through the mask is converted into a polymer cross-linked by light and thus does not react with a developer. The photoresist in the shielding region M3 which is not exposed to light is removed by reaction with the developer. Therefore, an emission structure may be formed in the second area b. After the developing process, a baking process, (e.g., a heating process) may be performed to form the first bank layer 141, the second bank layer 142, and the spacer 246. Therefore, the first bank layer 141, the second bank layer 142, and the spacer 246 can be formed by the same process such as the halftone process. Thus, the manufacturing process can be simplified.

Further, as illustrated in FIG. 4, the emission structure 150 may be formed on a part of the first electrode 140 and on the second bank layer 142 and the spacer 246. Further, the second electrode 160 may be formed on the emission structure 150.

Furthermore, since the first bank layer 141, the second bank layer 142, and the spacer 246 include the black pigment, light is absorbed during the exposure process. Therefore, it is difficult to apply the halftone process thereto. In order to solve this problem, the amount of exposure may be increased during the exposure process. For example, the amount of exposure may be in the range of from 40 mJ to 100 mJ.

Figure 7:
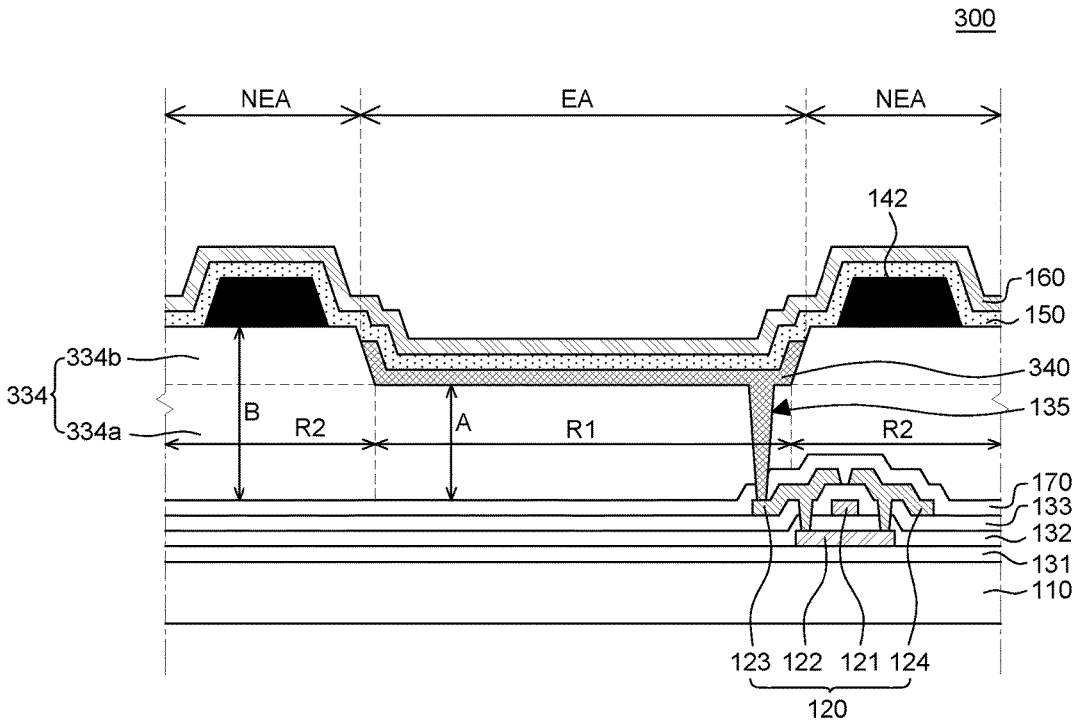
FIG. 7 is a cross-sectional view of an electroluminescence display device according to still another exemplary embodiment of the present disclosure.

FIG. 7 is a cross-sectional view of an electroluminescence display device according to still another exemplary embodiment of the present disclosure.

In explaining an electroluminescence display device 300 according to still another exemplary embodiment of the present disclosure, detailed description of components identical or corresponding to those of the above-described exemplary embodiments will be omitted or briefly provided.

A planarization layer 334 is formed on the passivation layer 170. The planarization layer 334 functions to flatten components such as the thin film transistor 120 on the substrate 110. That is, an upper surface of the planarization layer 334 formed on the thin film transistor 120 has a flatten surface. The planarization layer 334 may be configured as a single layer or a plurality of layers, and may be formed of an organic material. For example, the planarization layer 334 maybe formed of polyimide, photo acryl, or benzocyclobutene (BCB), but is not limited thereto. The passivation layer 170 and the planarization layer 334 include the contact hole 135 for electrically connecting the thin film transistor 120 and a first electrode 340 in each sub-pixel.

Further, referring to FIG. 7, the planarization layer 334 of the electroluminescence display device 300 according to still another exemplary embodiment of the present disclosure may include a first area R1 having a first thickness A and a second area R2 having a second thickness B greater than the first thickness A. The first thickness A may be the thickness from an upper surface of the passivation layer 170 to a lower surface of the first electrode 340. Further, the second thickness B may be the thickness from the upper surface of the passivation layer 170 to a lower surface of the second bank layer 142.

The electroluminescence display device 300 according to still another exemplary embodiment of the present disclosure includes an emission area EA and a non-emission area NEA. The emission area EA corresponds to an area where the first electrode 140 and the emission structure 150 are in direct contact with each other. The non-emission area NEA corresponds to an area where the first electrode 140 and the emission structure 150 are separated by the first bank layer 141. The first area R1 of the planarization layer 334 may be positioned corresponding to the emission area EA, and the second area R2 may be positioned corresponding to the non-emission area NEA. More specifically, the planarization layer 334 is formed to have the first thickness A in the first area R1 and the second thickness B greater than the first thickness A in the second area R2. Thus, the planarization layer 334 may be thicker in the non-emission area NEA than in the emission area EA.

Further, in the electroluminescence display device 300 according to still another exemplary embodiment of the present disclosure, the first area R1 of the planarization layer 334 corresponding to the emission area EA is positioned between the second areas R2 of the planarization layer 334 corresponding to the non-emission areas NEA. Therefore, the second area R2 of the planarization layer 334 may function as a first bank layer 334b that defines the emission area EA of the electroluminescence display device 300.

Further, the planarization layer 334 including the first area R1 having the first thickness A and the second area R2 having the second thickness B greater than the first thickness A may be formed by the halftone process using a halftone mask. The halftone mask includes a shielding part, a transmission part, and a transflective part. The shielding part refers to a part that shields light. The transmission part refers to a part that transmits light. The transflective part refers to a part that transmits a smaller amount of light than the transmission part. If the halftone mask is used, different amount of light can be applied. Thus, a pattern having different heights can be formed.

That is, the first bank layer 334b included in the planarization layer 334 may be formed of the same material on the same layer as a bottom planarization layer 334a. The first bank layer 334b and the bottom planarization layer 334a may be formed by the same process using the halftone mask. The first bank layer 334b of the planarization layer 334 may be formed of one of polyimide, photo acryl, or benzocyclobutene (BCB) in the same manner as the bottom planarization layer 334a.

A permittivity of the first bank layer 334b of the planarization layer 334 in the electroluminescence display device 300 according to still another exemplary embodiment of the present disclosure may be determined considering leakage current to an adjacent sub-pixel. The leakage current refers to a current flowing to an unintended sub-pixel adjacent to a target sub-pixel through the common transport layer such as the hole injection layer or the hole transport layer, when another current is applied to drive the target sub-pixel. Since the unintended sub-pixel emits light, the leakage current causes color mixing of light output from adjacent sub-pixels and a decrease in luminance. To prevent leakage current, the first bank layer 334b of the planarization layer 334 in the electroluminescence display device 300 according to still another exemplary embodiment of the present disclosure may be formed of a material with a low permittivity. Specifically, the first bank layer 334b may be formed of a material with a permittivity of, preferably, 7 $C/m^2$ (Coulomb/$m^2$) or less.

The first electrode 340 is formed on the planarization layer 334. The first electrode 340 may be an anode and may be formed of a conductive material having a relatively high work function value. Thus, the first electrode 340 functions to supply holes to a light emitting layer of the emission structure 150. The first electrode 340 is formed of a transparent conductive material, and may be formed of, for example, indium tin oxide (ITO), indium zinc oxide (IZO), and the like, but is not limited thereto.

If the electroluminescence display device 300 according to still another exemplary embodiment of the present disclosure is of a top-emission type, light emitted from the light emitting layer of the emission structure 150 is reflected by the first electrode 340. In this case, a reflective layer formed of a metal material, for example, aluminum (Al) or silver (Ag), having a high reflection efficiency may be further formed on an upper or lower part of the first electrode 340 in order for the light to be projected in an upward direction through the second electrode 160.

For example, the first electrode 340 may have a two-layer structure in which a transparent conductive layer formed of a transparent conductive material and a reflective layer are laminated in sequence. Otherwise, the first electrode 340 may have a three-layer structure in which a transparent conductive layer, a reflective layer, and a transparent conductive layer are laminated in sequence. The reflective layer may be formed of silver (Ag) or an alloy including silver. For example, the reflective layer may be formed of silver (Ag) or APC (Ag/Pd/Cu).

Referring to FIG. 7, in the electroluminescence display device 300 according to still another exemplary embodiment of the present disclosure, at least a part of the first electrode 340 may be positioned on an inclined surface of the first bank layer 334b of the planarization layer 334. In a comparative electroluminescence display device, a first electrode is positioned under a bank layer. Thus, an emission area of the electroluminescence display device is limited to a width of the first electrode exposed under the bank layer. Meanwhile, as described above, at least a part of the first electrode 340 may be positioned on the inclined surface of the first bank layer 334b. In this case, a width of the first electrode 340 can be increased and a width of the emission area EA of the electroluminescence display device 300 is increased as compared with the comparative structure. Therefore, an aperture ratio of the electroluminescence display device 300 can be improved. Further, the planarization layer 334 and the first bank layer 334b are formed by the same process, allowing a reduction in production cost.

In the comparative electroluminescence display device, the bank layer is formed of a transparent material.

Therefore, light incident from the outside is transmitted by the transparent bank layer and then reflected by the first electrode 340, and the like including a layer positioned under the bank layer and formed of a metal material. Therefore, in the electroluminescence display device 300, reflection of external light may occur. Further, if the electroluminescence display device 300 is applied to an automotive display, it is difficult to apply the electroluminescence display device 300 to the automotive display due to reflection of external light. To prevent reflection of external light by an electroluminescence display device, the second bank layer 142 of the electroluminescence display device 300 according to still another exemplary embodiment of the present disclosure maybe formed of a material that reduces reflection of external light.

Referring to FIG. 7, in the electroluminescence display device 300 according to still another exemplary embodiment of the present disclosure, the second bank layer 142 including the black pigment may be disposed on the second area R2 of the planarization layer 334 having the second thickness B on the first bank layer 334b. That is, the photoresist for forming the second bank layer 142 may be a material including the black pigment.

In the electroluminescence display device 300 according to still another exemplary embodiment of the present disclosure, the planarization layer 334 on the thin film transistor includes the first area R1 having the first thickness A and the second area R2 having the second thickness B greater than the first thickness A. The second bank layer 142 formed of a material including the black pigment is formed on the second area R2 of the planarization layer 334. Thus, when an incident angle of light incident into the electroluminescence display device 300 is 45 degrees, a reflection luminance at a reflection angle of 30 degrees may be set to 30 nit or less. Thus, it is possible to reduce a surface reflection luminance by reducing reflection of external light and thus possible to improve field visibility of the electroluminescence display device as compared with the comparative structure. Further, in the electroluminescence display device 300 according to still another exemplary embodiment of the present disclosure, at least a part of the first electrode 340 is formed to be positioned on the inclined surface of the second area R2. Thus, the width of the emission area EA of the electroluminescence display device 300 is increased. Therefore, an aperture ratio can be improved. Furthermore, in the electroluminescence display device 300 according to still another exemplary embodiment of the present disclosure, the planarization layer 334 is formed as the first bank layer 334b by the halftone process. Therefore, the manufacturing process of the electroluminescence display device 300 can be simplified.

Figure 8:
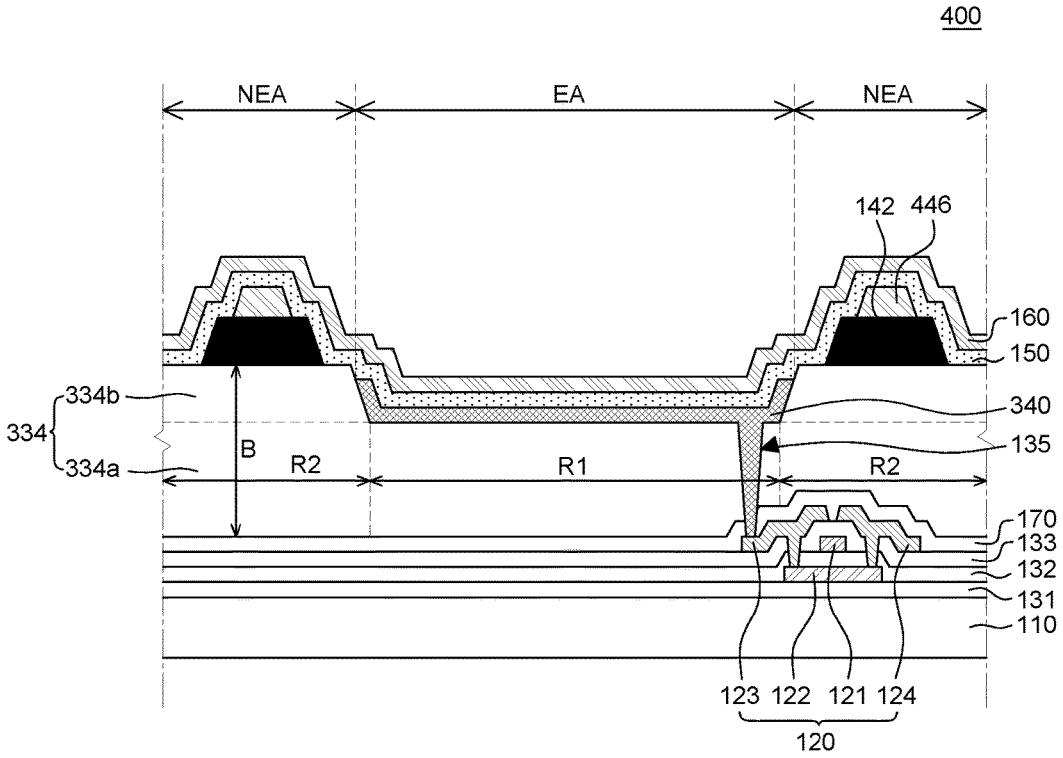
FIG. 8 is a cross-sectional view of an electroluminescence display device according to still another exemplary embodiment of the present disclosure.

FIG. 8 is a cross-sectional view of an electroluminescence display device according to still another exemplary embodiment of the present disclosure.

In explaining an electroluminescence display device 400 according to still another exemplary embodiment of the present disclosure, detailed description of components identical or corresponding to those of the above-described exemplary embodiment will be omitted or briefly provided.

Referring to FIG. 8, the electroluminescence display device 400 according to still another exemplary embodiment of the present disclosure may further include a spacer 446 on a partial area of the second bank layer 142. The spacer 446 may be formed of a transparent material. The transparent material may be one of polyimide, photo acryl, and benzocyclobutene (BCB).

Further, in order to reduce reflection of external light, the spacer 446 maybe formed including the black pigment in the same manner as the second bank layer 142. In this case, the second bank layer 142 and the spacer 446 may be formed by patterning through the same process such as halftone process.

That is, if the spacer 446 is formed of the same material as the second bank layer 142, the second bank layer 142 and the spacer 446 can be formed through the halftone process. Therefore, the manufacturing process of the electroluminescence display device 400 can be simplified.

That is, in the electroluminescence display device 400 according to still another exemplary embodiment of the present disclosure, the planarization layer 334 on the thin film transistor includes the first area R1 having the first thickness A and the second area R2 having the second thickness B greater than the first thickness A. The second bank layer 142 formed of a material including the black pigment is formed on the second area R2 of the planarization layer 334 and the spacer 446 is formed on the second bank layer 142. Thus, it is possible to reduce a surface reflection luminance by reducing reflection of external light and thus possible to improve field visibility of the electroluminescence display device 400 as compared with the comparative structure.

Further, in the electroluminescence display device 400 according to still another exemplary embodiment of the present disclosure, if the spacer 446 on the second bank layer 142 is formed of the same material as the second bank layer 142, the second bank layer 142 and the spacer 446 can be formed by the same process. Therefore, the manufacturing process of the electroluminescence display device 400 can be simplified.

FIG. 9A through FIG. 9E are diagrams provided to explain a method of manufacturing an electroluminescence display device according to still another exemplary embodiment of the present disclosure.

Figure 9A:
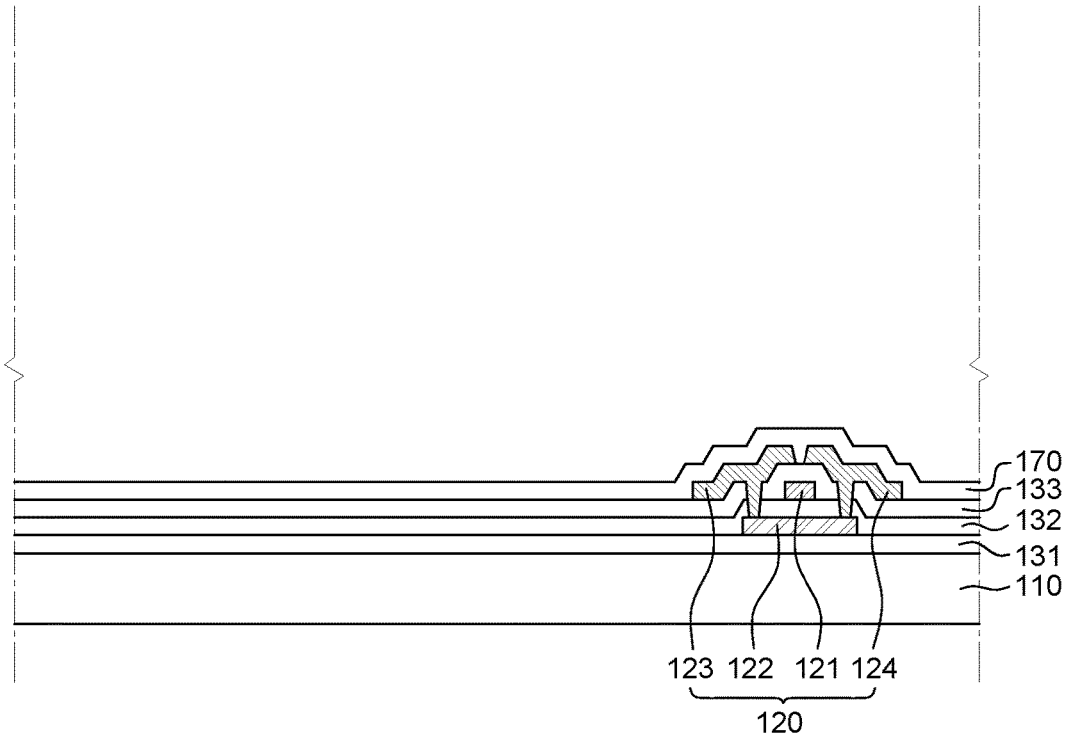
FIG. 9A through FIG. 9E are diagrams provided to explain a method of manufacturing an electroluminescence display device according to still another exemplary embodiment of the present disclosure.

Referring to FIG. 9A, the buffer layer 131 is formed on the substrate 110, and the thin film transistor 120 including the semiconductor layer 122, the gate insulation layer 132, the gate electrode 121, the interlayer insulation layer 133, the source electrode 123, and the drain electrode 124 are formed on the buffer layer 131. Further, the passivation layer 170 is formed on the thin film transistor 120.

Figure 9B:
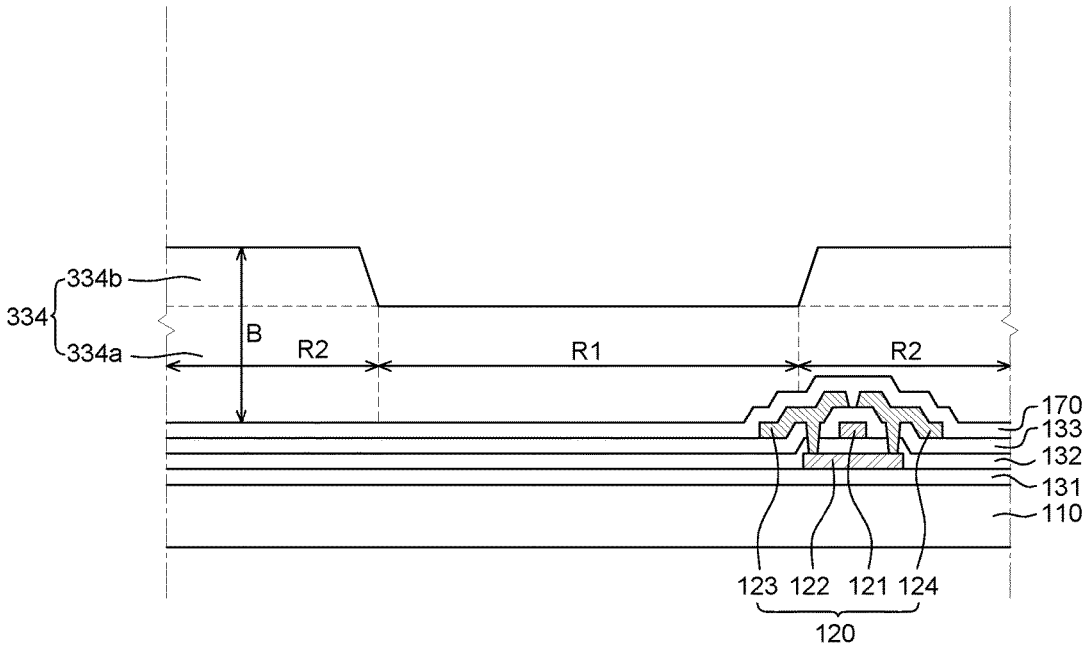

Then, referring to FIG. 9B, the planarization layer 334 is formed on the passivation layer 170. The planarization layer 334 may include the first area R1 having the first thickness A and the second area R2 having the second thickness B greater than the first thickness A.

More specifically, the first area R1 of the planarization layer 334 may be formed to have the first thickness A and correspond to the emission area EA. The second area R2 of the planarization layer 334 may be formed to have the second thickness B greater than the first thickness A and correspond to the non-emission area NEA. That is, the planarization layer 334 maybe thicker in the non-emission area NEA than in the emission area EA. The second area R2 of the planarization layer 334 may be the first bank layer 334b of the electroluminescence display device 300 according to still another exemplary embodiment of the present disclosure.

The planarization layer 334 including the first area R1 having the first thickness A and the second area R2 having the second thickness B greater than the first thickness A may be formed by the halftone process using the halftone mask. That is, the first bank layer 334b of the planarization layer 334 may be formed of the same material on the same layer as the bottom planarization layer 334a. The first bank layer 334b of the planarization layer 334 and the bottom planarization layer 334a may be formed by patterning through the same process such as the halftone process.

Figure 9C:
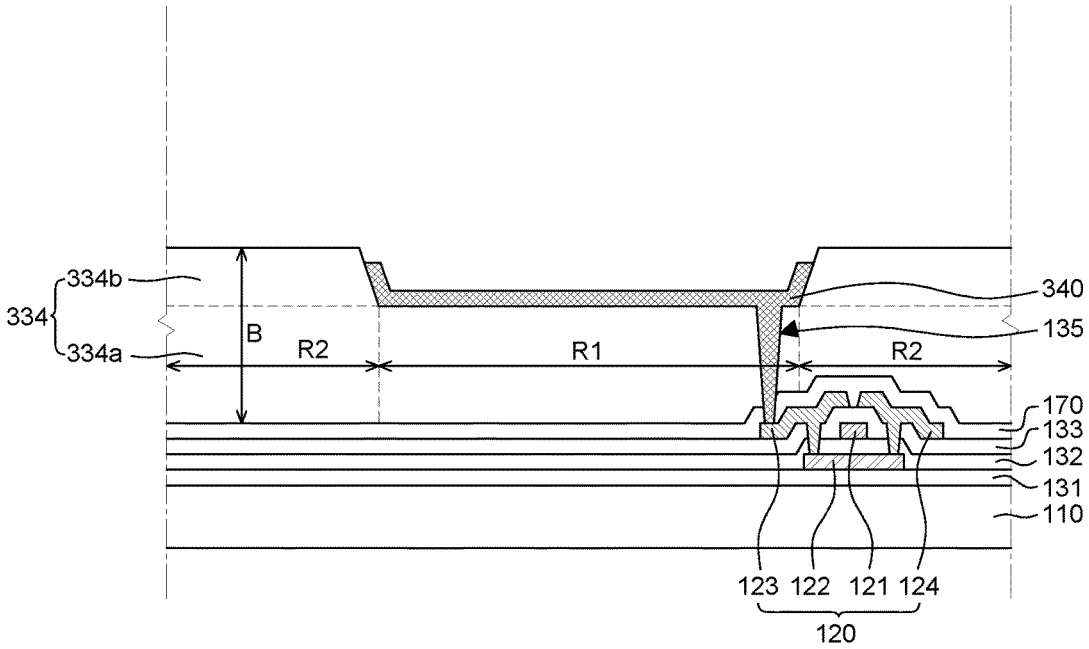

Then, referring to FIG. 9C, the first electrode 340 is formed on the bottom planarization layer 334a of the planarization layer 334 and on a partial area of the first bank layer 334b. The first electrode 340 is electrically connected to the thin film transistor 120 of each of the sub-pixel through the contact hole 135 formed in the passivation layer 170 and the planarization layer 334.

Further, at least a part of the first electrode 340 may be positioned on the inclined surface of the first bank layer 334b. As such, at least a part of the first electrode 340 may be positioned on the inclined surface of the first bank layer 334b. In this case, a width of the first electrode 340 can be increased and a width of the emission area EA of the electroluminescence display device 300 is increased as compared with the comparative structure. Therefore, an aperture ratio of the electroluminescence display device 300 can be improved.

Figure 9D:
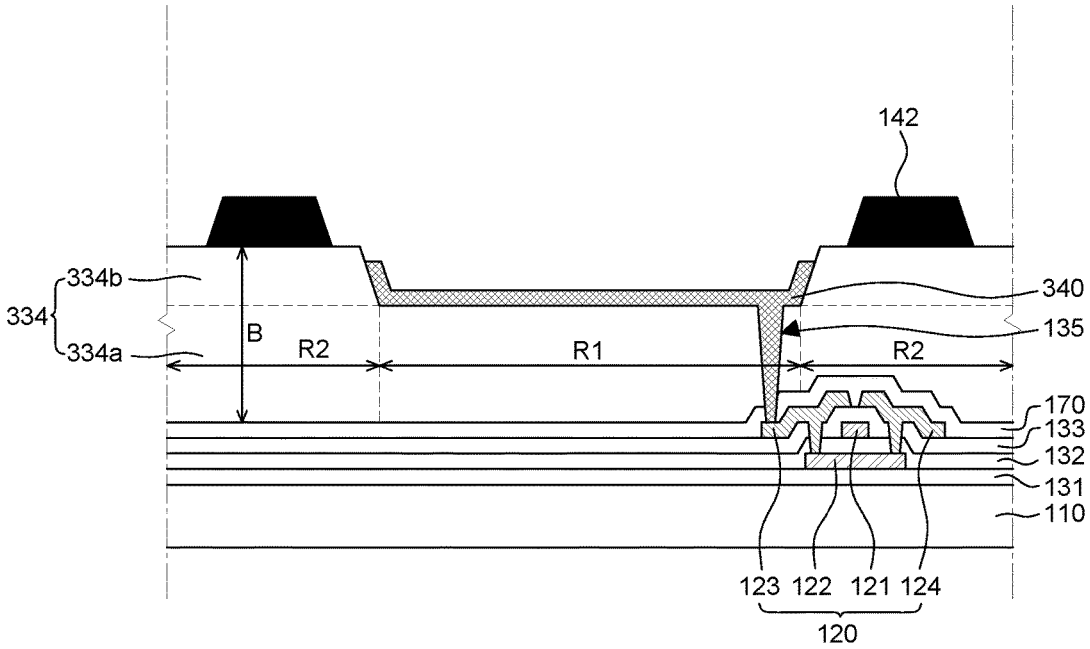

Then, referring to FIG. 9D, the second bank layer 142 formed of a material including the black pigment is disposed on the second area R2 of the planarization layer 334 having the second thickness B on the first bank layer 334b. Since the second bank layer 142 is formed of a material including the black pigment, when an incident angle of an incident light is 45 degrees, a reflection luminance at a reflection angle of 30 degrees may be set to 30 nit or less. Thus, it is possible to reduce a reflection.

In order to stably form the bank layer having a multiple layer structure, a lower end portion of the second bank layer 142 may have a smaller width than an upper end portion of the first bank layer 334b of the planarization layer 334.

Figure 9E:
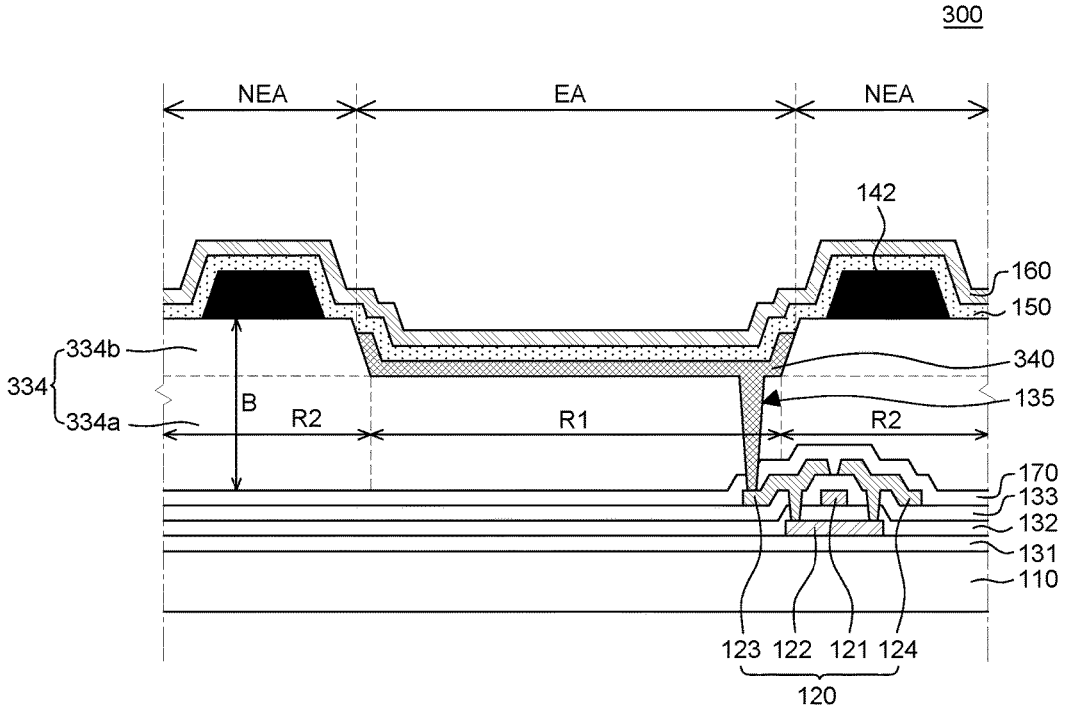

Then, referring to FIG. 9E, the emission structure 150 is formed on the first electrode 340, the first bank layer 334b, and the second bank layer 142. The emission structure 150 may include various transport layers as necessary and may also include a plurality of light emitting layers. Further, the second electrode 160 is formed on the emission structure 150, so that the electroluminescence display device 300 according to still another exemplary embodiment of the present disclosure can be manufactured.

That is, in the electroluminescence display device 300 according to still another exemplary embodiment of the present disclosure, the planarization layer 334 on the thin film transistor includes the first area R1 having the first thickness A and the second area R2 having the second thickness B greater than the first thickness A. The second bank layer 142 formed of a material including the black pigment is formed on the second area R2 of the planarization layer 334. Thus, it is possible to reduce a surface reflection luminance by reducing reflection of external light and thus possible to improve field visibility of the electroluminescence display device 300 as compared with the comparative structure. Further, in the electroluminescence display device 300 according to still another exemplary embodiment of the present disclosure, the bank layer includes the first bank layer 334b formed of the same material on the same layer as the planarization layer 334 on the thin film transistor 120 and the second bank layer 142 positioned on the first bank layer 334b and including the black pigment. Thus, an optical density of the bank layer can be improved. Therefore, it is possible to provide the electroluminescence display device 300 capable of reducing reflection of external light. Further, in the electroluminescence display device 300 according to still another exemplary embodiment of the present disclosure, at least a part of the first electrode 340 is positioned on the inclined surface of the first bank layer 334b. Thus, a width of the emission area EA of the electroluminescence display device 300 is increased. Thus, an aperture ratio of the electroluminescence display device 300 can be improved. Furthermore, in the electroluminescence display device 300 according to still another exemplary embodiment of the present disclosure, the planarization layer 334 is formed as the first bank layer 334b by the same process such as the halftone process. Therefore, the manufacturing process of the electroluminescence display device 300 can be simplified.

Figure 10:
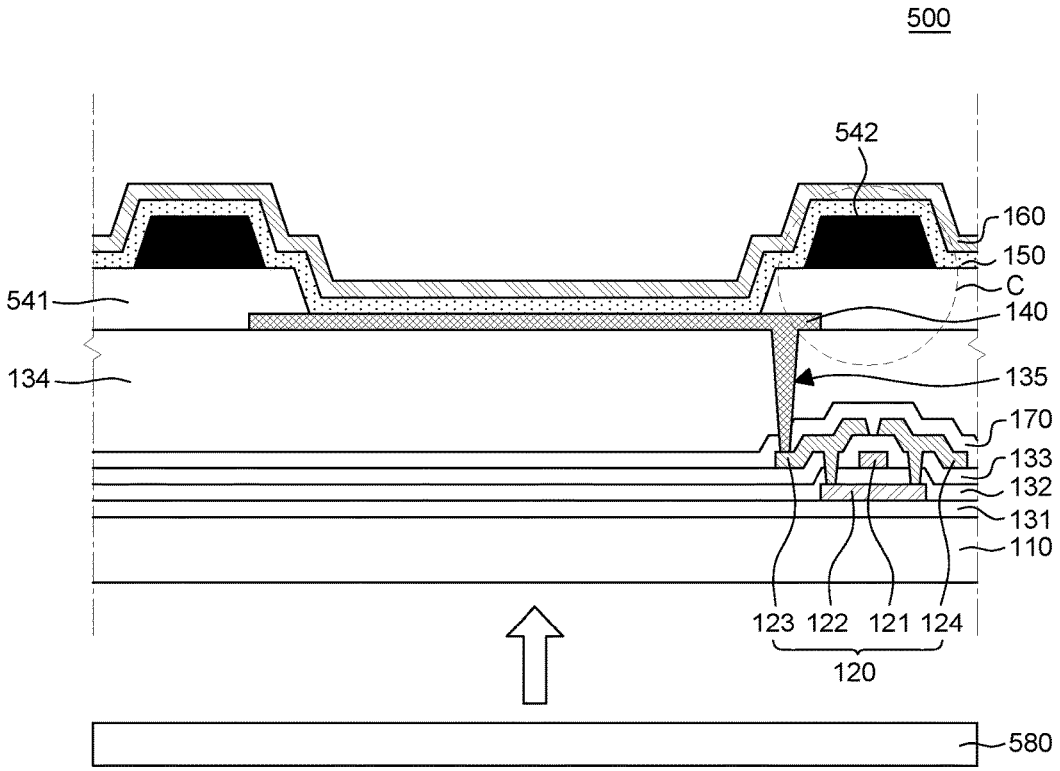
FIG. 10 is a cross-sectional view of an electroluminescence display device according to still another exemplary embodiment of the present disclosure.

FIG. 10 is a cross-sectional view of an electroluminescence display device according to still another exemplary embodiment of the present disclosure.

In explaining an electroluminescence display device 500 according to still another exemplary embodiment of the present disclosure, detailed description of components identical or corresponding to those of the above-described exemplary embodiment will be omitted or briefly provided.

The electroluminescence display device 500 according to still another exemplary embodiment of the present disclosure may include a light source 580 for fingerprint recognition positioned under the substrate 110. The light source 580 may be further provided to the electroluminescence display device 500 in order to implement optical fingerprint recognition. Light irradiated from the light source 580 for fingerprint recognition toward the substrate 110 is reflected by a user's finger. Then, the reflected light is sensed by a photo sensor including the thin film transistor above the substrate 110, so that the user's fingerprint is recognized.

In one or more embodiments, light having a short wavelength of 300 nm to 700 nm or light having a long wavelength of 700 nm or more may be applied by a light source 580 for fingerprint recognition in various ways depending on a structure of an electroluminescence display device.

Referring to FIG. 10, the electroluminescence display device 500 according to still another exemplary embodiment of the present disclosure includes a first bank layer 541 covering at least a part of the first electrode 140 and formed on the planarization layer 134 and a second bank layer 542 formed on the first bank layer 541.

Further, each of the first bank layer 541 and the second bank layer 542 of the electroluminescence display device 500 according to still another exemplary embodiment of the present disclosure is formed including the black pigment.

In the comparative electroluminescence display device, the bank layer is formed of a transparent material. Therefore, light incident from the outside is transmitted by the transparent bank layer and then reflected by the first electrode 140 including a layer positioned under the bank layer and formed of a metal material. Therefore, in the electroluminescence display device 500, reflection of external light may occur. Further, if the electroluminescence display device 500 is applied to an automotive display, it is difficult to apply the electroluminescence display device 500 to the automotive display due to reflection of external light. In order to reduce reflection of external light by an electroluminescence display device, the first bank layer 541 and the second bank layer 542 of the electroluminescence display device 500 according to still another exemplary embodiment of the present disclosure maybe formed of a material that reduces reflection of external light.

Further, in order to perform fingerprint recognition, the first bank layer 541 and the second bank layer 542 may reduce transmission of light output from under the substrate 110 such that light irradiated from the light source 580 for fingerprint recognition under the substrate 110 cannot be recognized by the user.

Referring to FIG. 10, each of the first bank layer 541 and the second bank layer 542 of the electroluminescence display device 500 according to still another exemplary embodiment of the present disclosure maybe formed of a material including the black pigment. That is, a photoresist for forming the first bank layer 541 and the second bank layer 542 may be a material including the black pigment. The black pigment may be formed of an organic material or an inorganic material. In this case, the photoresist and the black pigment may be substantially the same as the photoresist and the black pigment described above with reference to FIG. 1.

Further, since the first bank layer 541 and the second bank layer 542 include the black pigment, an optical density which is the degree of shielding of light may be increased. As the optical density is increased, reflection of external light can be reduced. However, if the optical density is excessively increased, a permittivity may be increased, so that leakage current to an adjacent sub-pixel maybe generated. In consideration of this matter, the first bank layer 541 and the second bank layer 542 may have an optical density of, preferably, 4 or less.

Further, since the first bank layer 541 and the second bank layer 542 are formed of a material including the black pigment, when an incident angle of an incident light incident is 45 degrees, a reflection luminance at a reflection angle of 30 degrees may be set to 30 nit or less. Thus, it is possible to reduce a reflection luminance by improving reflection of external light. That is, when an incident angle of an incident light is 45 degrees, the left and right reflection luminance may be 30 nit or less at a reflection angle of 30 degrees. Further, if the electroluminescence display device 500 is applied to an automotive display, a display device with reduced reflection of external light can be provided. Furthermore, since reflection of external light can be reduced by the electroluminescence display device 500, a visual sensitivity, for example, in the left and right directions of the electroluminescence display device 500 can be improved.

Also, the first bank layer 541 and the second bank layer 542 of the electroluminescence display device 500 according to still another exemplary embodiment of the present disclosure are formed to have different refractive indexes from each other. Further, the refractive indexes of the first bank layer 541 and the second bank layer 542 are different from a refractive index of the planarization layer 134.

More specifically, the first bank layer 541 may have a higher refractive index than the planarization layer 134 positioned under the first bank layer 541. For example, if a material having a refractive index of 1.49 is applied as the planarization layer 134, a material having a refractive index of 1.55 may be applied as the first bank layer 541. For example, the first bank layer 541 may be formed of one of polyimide, photo acryl, and benzocyclobutene (BCB).

Further, the second bank layer 542 may have a higher refractive index than the first bank layer 541 positioned under the second bank layer 542. For example, if a material having a refractive index of 1.55 is applied as the first bank layer 541, a material having a refractive index of 1.60 may be applied as the second bank layer 542. For example, the second bank layer 542 having a higher refractive index than the first bank layer 541 may be formed including 4,4-thiodibenzenethiol (TDT)-based epoxy acrylate.

That is, in the electroluminescence display device 500 according to still another exemplary embodiment of the present disclosure, the refractive index of the first bank layer 541 maybe set to be higher than that of the planarization layer 134. Further, the refractive index of the second bank layer 542 may be set to be higher than that of the first bank layer 541.

While light output from the light source 580 for fingerprint recognition disposed under the substrate 110 passes through the planarization layer 134, the first bank layer 541, and the second bank layer 542 having different refractive indexes from each other, a part of the light may be reflected toward the light source 580 for fingerprint recognition and then shielded by the first bank layer 541 and the second bank layer 542.

That is, light output from the light source 580 for fingerprint recognition disposed under the substrate 110 is reflected in part by an interface between the planarization layer 134 and the first bank layer 541 set to different refractive indexes from each other. Then, the light transmitted through the first bank layer 541 may be reflected in part by an interface between the first bank layer 541 and the second bank layer 542 having different refractive indexes from each other.

Further, in the electroluminescence display device 500 according to still another exemplary embodiment of the present disclosure, a thickness of the first bank layer 541 may be set to satisfy $D=(2m+1)\lambda/4$ when D is the thickness of the first bank layer 541, $\lambda$ is a wavelength of the light source 580 for fingerprint recognition having a wavelength of 700 nm or more, and m is a positive integer or zero.

Therefore, if the thickness of the first bank layer 541 of the electroluminescence display device 500 according to still another exemplary embodiment of the present disclosure is set to satisfy $D=(2m+1)\lambda/4$, a phase of the light reflected by the interface between the planarization layer 134 and the first bank layer 541 is different 180-degree from a phase of the light reflected by the interface between the first bank layer 541 and the second bank layer 542. Light having opposite phases are overlapped in wavelength with each other, resulting in destructive interference. Thus, the reflected light can be dissipated. Therefore, it is possible to reduce recognition of the light output from the light source 580 for fingerprint recognition from the outside.

Further, referring to FIG. 10, in order to stably form the second bank layer 542 on the first bank layer 541 having multiple layer structure, a lower end portion of the second bank layer 542 may have a smaller width than an upper end portion of the first bank layer 541.

Further, a permittivity of the first bank layer 541 of the electroluminescence display device 500 according to still another exemplary embodiment of the present disclosure is determined according to leakage current to an adjacent sub-pixel. The leakage current refers to a current flowing to an unintended sub-pixel adjacent to a target sub-pixel through the common transport layer such as the hole injection layer or the hole transport layer, when a current is applied to drive the target sub-pixel. Since the unintended sub-pixel emits light, the leakage current causes color mixing of light output from adjacent sub-pixels and a decrease in luminance. Therefore, the first bank layer 541 on the planarization layer 134 in the electroluminescence display device 500 according to still another exemplary embodiment of the present disclosure may be formed of a material with a low permittivity. Specifically, the first bank layer 541 may be formed of a material with a permittivity of, preferably, 7 $C/m^2$ (Coulomb/$m^2$) or less.

Figure 11:
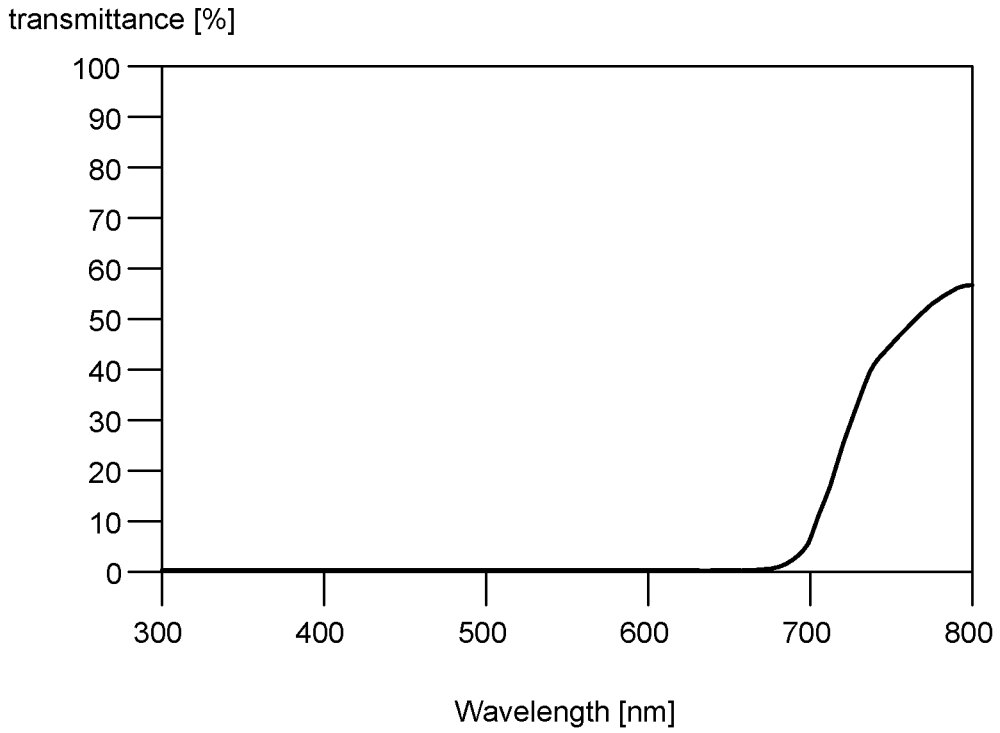
FIG. 11 is a diagram illustrating a light transmittance of a first bank layer in an electroluminescence display device in each wavelength band according to still another exemplary embodiment of the present disclosure.

FIG. 11 is a diagram illustrating a light transmittance of a first bank layer in an electroluminescence display device in each wavelength band according to still another exemplary embodiment of the present disclosure.

According to the result of evaluation of a light transmittance of the first bank layer 541 in the electroluminescence display device 500 in each wavelength band with reference to FIG. 11, light is absorbed by the first bank layer 541 in a wavelength band of 300 nm to 700 nm. Thus, transmission of the light may not occur. However, in a wavelength band of 700 nm or more, the light transmittance of the first bank layer 541 may be sharply increased.

That is, if only the first bank layer 541 is applied to the electroluminescence display device 500, when a light source for fingerprint recognition is disposed under the substrate, the first bank 541 has a high light-shielding power with respect to a light source having a short wavelength of 300 nm to 700 nm but has a low light-shielding power with respect to a light source having a long wavelength of 700 nm or more. Therefore, light output from the light source 580 for fingerprint recognition under the substrate 110 cannot be completely shielded by the bank layer, and may be recognized by the user. Thus, a portion of a display may appear red causing degradation in image quality.

Figure 12:
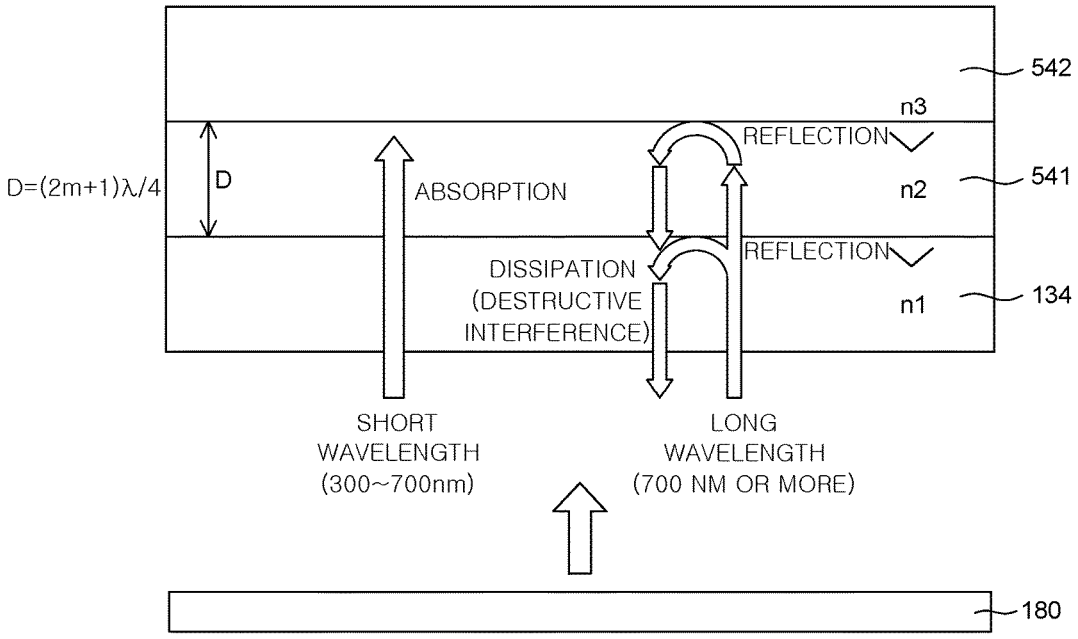
FIG. 12 is a cross-sectional view of an area A of FIG. 10.

FIG. 12 is a cross-sectional view of an area C of FIG. 10.

That is, FIG. 12 is a diagram provided to explain the conditions for light absorption, reflection and destructive interference in the first bank layer 541 and the second bank layer 542 of the electroluminescence display device 500 according to still another exemplary embodiment of the present disclosure.

Referring to FIG. 12, the electroluminescence display device 500 according to still another exemplary embodiment of the present disclosure includes the first bank layer 541 and the second bank layer 542 positioned on the planarization layer 134 having different refractive indexes.

Referring to FIG. 12, if light output from a light source 180 for fingerprint recognition has a short wavelength band, e.g., between 300 nm and 700 nm, as described above with reference to FIG. 11, the light can be absorbed and shielded by the first bank layer 541.

Further, referring to FIG. 12, the first bank layer 541 and the second bank layer 542 of the electroluminescence display device 500 according to still another exemplary embodiment of the present disclosure are formed to have different refractive indexes from each other. In one example, a refractive index n1 of the planarization layer 134, a refractive index n2 of the first bank layer 541, and a refractive index n3 of the second bank layer 542 may be n1<n2<n3.

The light source 180 for fingerprint recognition having a long wavelength of 700 nm or more may be applied to the electroluminescence display device 500 according to still another exemplary embodiment of the present disclosure. In this case, if a refractive index of the first bank layer 541 is set to be higher than that of the planarization layer 134, light output from the light source 180 for fingerprint recognition positioned under the substrate 110 may be reflected in part toward the light source 180 for fingerprint recognition by the interface between the planarization layer 134 and the first bank layer 541 having different refractive indexes from each other.

Further, if a refractive index of the second bank layer 542 is set to be higher than that of the first bank layer 541, the light passing through the interface between the planarization layer 134 and the first bank layer 541 may also be reflected in part toward the light source 180 for fingerprint recognition by the interface between the first bank layer 541 and the second bank layer 542 having different refractive indexes from each other.

That is, light output from the light source 180 for fingerprint recognition positioned under the substrate 110 may be reflected in part by the interface between the planarization layer 134 and the first bank layer 541 having different refractive indexes from each other. Also, the light passing through the first bank layer 541 may be reflected in part by the interface between the first bank layer 541 and the second bank layer 542 having different refractive indexes from each other.

Therefore, light output from the light source 180 for fingerprint recognition positioned under the substrate 110 may be reflected in part toward the light source 180 for fingerprint recognition while passing through the planarization layer 134, the first bank layer 541, and the second bank layer 542 having different refractive indexes from each other. Thus, the light can be shielded by the first bank layer 541 and the second bank layer 542.

Further, in the electroluminescence display device 500 according to still another exemplary embodiment of the present disclosure, a thickness of the first bank layer 541 may be set to satisfy $D=(2m+1)\lambda/4$ when D is the thickness of the first bank layer 541, $\lambda$ is a wavelength of the light source 180 for fingerprint recognition having a wavelength of 700 nm or more, and m is a positive integer or zero.

When light passes through mediums having different refractive indexes from each other, transmission and reflection occur at an interface between the mediums having different refractive indexes from each other. As the light travels from the medium having a low refractive index to the medium having a high refractive index, a phase of the wavelength may be changed 180-degree.

Therefore, if the thickness of the first bank layer 541 of the electroluminescence display device 500 according to still another exemplary embodiment of the present disclosure satisfies $D=(2m+1)\lambda/4$, a phase of the light reflected by the interface between the planarization layer 134 and the first bank layer 541 may be 180-degree offset from a phase of the light reflected by the interface between the first bank layer 541 and the second bank layer 542. The light having the opposite phases may cause destructive interference and be dissipated.

Therefore, light output from the light source 180 for fingerprint recognition positioned under the substrate 110 may be reflected in part toward the light source 180 for fingerprint recognition and thus shielded in part while passing through the planarization layer 134, the first bank layer 541, and the second bank layer 542 having different refractive indexes from each other. A thickness of the first bank layer 541 may satisfy $D=(2m+1)\lambda/4$. Thus, the reflected light can be dissipated by destructive interference. Therefore, reflection of light by the metal layer on the substrate can be reduced. Accordingly, an optical density OD of the first bank layer 541 and the second bank layer 542 can be improved and recognition of light by the user can be reduced.

That is, the electroluminescence display device 500 according to still another exemplary embodiment of the present disclosure includes the first bank layer 541 and the second bank layer 542 each formed of a material including the black pigment. The planarization layer 134, the first bank layer 541, and the second bank layer 542 have different refractive indexes from each other. Light output from the light source 180 for fingerprint recognition under the substrate 110 is reflected toward the light source 180 for fingerprint recognition from under the first bank layer 541 and the second bank layer 542 due to a difference in refractive index. The first bank layer 541 has a specific thickness suitable for a wavelength of the light source. Thus, the light reflected from under the first bank layer 541 and the second bank layer 542 may be dissipated by destructive interference. Therefore, the light output from the light source 180 for fingerprint recognition may not be recognized by a user viewing the display device disclosed herein.

Figure 13:
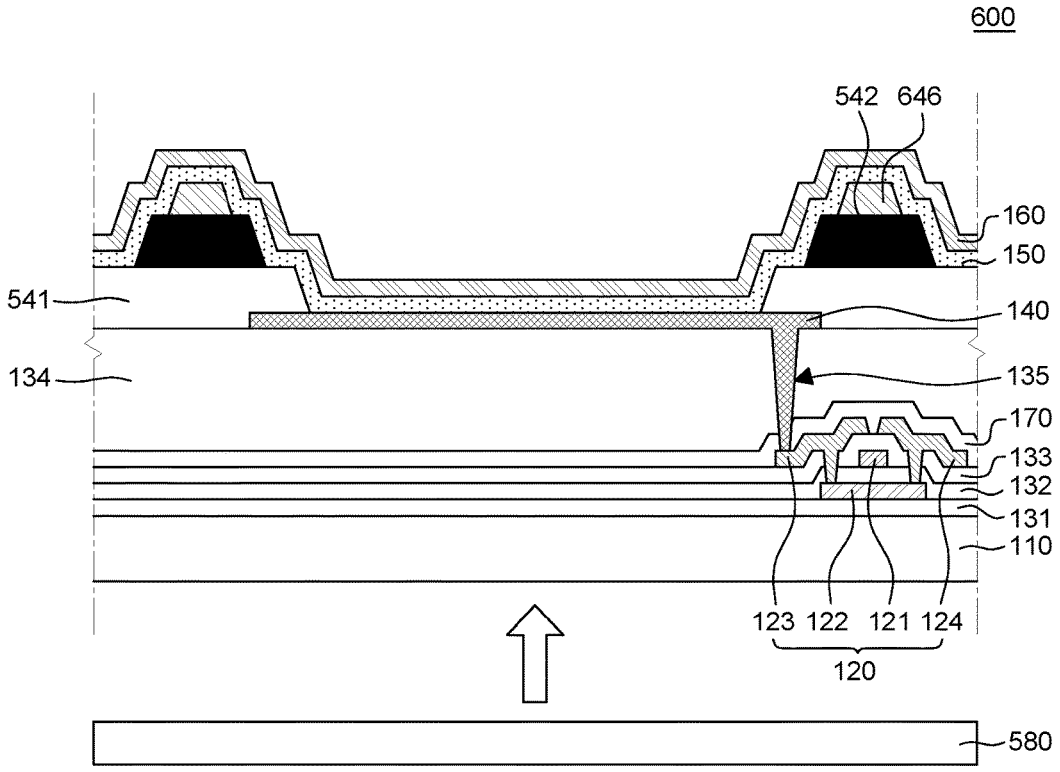
FIG. 13 is a cross-sectional view of an electroluminescence display device according to still another exemplary embodiment of the present disclosure.

FIG. 13 is a cross-sectional view of an electroluminescence display device according to still another exemplary embodiment of the present disclosure.

In explaining an electroluminescence display device 600 according to still another exemplary embodiment of the present disclosure, detailed description of components identical or corresponding to those of the above-described exemplary embodiment will be omitted or briefly provided.

Referring to FIG. 13, the electroluminescence display device 600 according to still another exemplary embodiment of the present disclosure includes a spacer 646 formed on a partial area of the second bank layer 542.

The spacer 646 may function to suppress a defect caused by a contact with a mask, when a plurality of transport layers or light emitting layers EML are deposited on the emission structure 150, or when the second electrode 160 is formed on the emission structure 150.

The spacer 646 may be formed of a transparent material. For example, the transparent material may be anyone of polyimide, photo acryl, and benzocyclobutene (BCB).

Further, the spacer 646 may be formed including the black pigment in the same manner as the first bank layer 541 or the second bank layer 542.

Furthermore, if the spacer 646 is formed of the same material as the second bank layer 542 and includes the black pigment, the second bank layer 542 and the spacer 646 may be formed by the halftone process using the halftone mask.

The halftone mask includes a shielding part, a transmission part, and a transflective part. The shielding part refers to a part that shields light. The transmission part refers to a part that transmits light. The transflective part refers to a part that transmits a smaller amount of light than the transmission part. If the halftone mask is used, different amount of light can be applied. Thus, a pattern having different heights can be formed through the same process.

The exemplary embodiments of the present disclosure can also be described as follows:

Embodiments disclosed herein relate to an electroluminescence display device including a thin film transistor, a planarization layer on the thin film transistor, a first bank layer on a surface of the planarization layer facing in a first direction, the thin film transistor disposed between the planarization layer and the first bank layer, the first bank layer having a higher refractive index than the planarization layer, a second bank layer on a surface of the first bank layer facing in the first direction, the second bank layer having a higher refractive index than the first bank layer, and a light emitting layer between a first electrode on the planarization layer and a second electrode on the second bank layer.

In one or more embodiments, the second bank layer includes a black pigment.

In one or more embodiments, the second bank layer includes more black pigments than the first bank layer.

In one or more embodiments, a permittivity of the first bank layer is less than a permittivity of the second bank layer.

In one or more embodiments, a portion of the second bank layer has a smaller width along a second direction perpendicular to the first direction than another portion of the second bank layer. The portion of the second bank layer maybe farther away from the first bank layer than said another portion of the second bank layer.

In one or more embodiments, the second bank layer is directly in contact with the first bank layer.

In one or more embodiments, the first bank layer has a thickness D, $D=(2m+1)\lambda/4$, $\lambda$ being a wavelength of light incident on the planarization layer in the first direction, $\lambda$ being 700 nm or more, m being an integer not less than zero. The first bank layer may be configured to absorb a portion of the light corresponding to a wavelength of 700 nm or less.

In one or more embodiments, the electroluminescence display device further includes a spacer on a surface of the second bank layer facing in the first direction. The spacer may include a black pigment.

Embodiments disclosed herein relate to an electroluminescence display device including a first electrode, a second electrode facing the first electrode, an emission layer between the first electrode and the second electrode, and a bank layer defining the emission layer. The bank layer may be disposed between the first electrode and the second electrode. The bank layer may include a first bank layer and a second bank layer. The second bank layer may include a black pigment. The first bank layer may be closer to the first electrode than the second bank layer, and the first bank layer may have a lower permittivity than the second bank layer.

In one or more embodiments, the first bank layer includes the black pigment.

In one or more embodiments, the second bank layer has more black pigments than the first bank layer.

In one or more embodiments, the second bank layer has a higher refractive index than the first bank layer.

In one or more embodiments, the electroluminescence display device further includes a spacer on a surface of the bank layer away from the first electrode. The spacer may be formed of a transparent material or including the black pigment.

Embodiments disclosed herein relate to an electroluminescence display device comprising a thin film transistor on a surface of a substrate facing in a first direction, a planarization layer on the surface of the substrate, the planarization layer covering the thin film transistor, the thin film transistor disposed between the planarization layer and the substrate, the planarization layer having a first area having a first thickness along the first direction and a second area having a second thickness along the first direction, the first thickness smaller than the second thickness, a first electrode on the first area of the planarization layer, the first electrode electrically connected to the thin film transistor, a bank layer on a portion of the second area of the planarization layer, the bank layer including a black pigment, an emission structure including a transport layer and a light emitting layer on a surface of the first electrode facing in the first direction, and a second electrode on a surface of the emission structure facing in the first direction.

In one or more embodiments, at least a part of the first electrode is positioned on an inclined surface of the planarization layer. The inclined surface may be disposed between the first area and the second area of the planarization layer. The inclined surface of the planarization layer may face in a slanted direction from the first direction.

In one or more embodiments, an optical density of the bank layer is 4 or less.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescence display device comprising:

a thin film transistor on a surface of a substrate facing in a first direction;

a planarization layer on the surface of the substrate, the planarization layer covering the thin film transistor, the thin film transistor disposed between the planarization layer and the substrate, the planarization layer having a first area having a first thickness along the first direction and a second area having a second thickness along the first direction, the first thickness smaller than the second thickness;

a first electrode on the first area of the planarization layer, the first electrode electrically connected to the thin film transistor;

a bank layer on a portion of the second area of the planarization layer, the bank layer including a black pigment;

an emission structure including a transport layer and a light emitting layer on a surface of the first electrode facing in the first direction; and a second electrode on a surface of the emission structure facing in the first direction,

*wherein the emission structure has a different thickness for each of a red sub-pixel area, a green sub-pixel area, and a blue sub-pixel area.*

2. The electroluminescence display device according to claim 1, wherein at least a part of the first electrode is positioned on an inclined surface of the planarization layer, the inclined surface disposed between the first area and the second area of the planarization layer.

3. The electroluminescence display device according to claim 2, wherein the inclined surface of the planarization layer faces in a slanted direction from the first direction.

4. The electroluminescence display device according to claim 1, wherein an optical density of the bank layer is 4 or less.

5. A display apparatus, comprising:

a substrate including an upper surface and a lower surface;

a thin film transistor on the upper surface of the substrate;

a planarization layer covering the thin film transistor and the upper surface of the substrate, the planarization layer including a first portion having a first thickness and a second portion having a second thickness, the first thickness smaller than the second thickness;

a first electrode on the planarization layer, the first electrode being at the first portion of the planarization layer and electrically connected to the thin film transistor;

a bank layer on the planarization layer, the bank layer being at the second portion of planarization layer and including a black pigment;

an emission structure on the first electrode, the emission structure including a transport layer and a light emitting layer; and

[an] *a* second electrode on the emission structure, the emission structure between the first electrode and the second electrode,

*wherein the emission structure has a different thickness for each of a red sub-pixel area, a green sub-pixel area, and blue sub-pixel area.*

6. The display apparatus according to claim 5, wherein the first portion of the planarization layer corresponds to an emission area where the first electrode and the emission structure are in direct contact with each other.

7. The display apparatus according to claim 6, wherein the first portion of the planarization layer is overlapped with the emission area.

8. The display apparatus according to claim 5, wherein the first electrode is spaced apart from the second portion of the planarization layer.

9. The display apparatus according to claim 5, wherein the second portion of the planarization layer includes an inclined surface, an upper surface, and a lower surface, the first portion of the planarization layer includes an upper surface and a lower surface, the upper surface of the first portion is connected to the inclined surface of the second portion.

10. The display apparatus according to claim 9, wherein both ends of the first electrode are on the inclined surface of the second portion of the planarization layer.

11. The display apparatus according to claim 10, wherein the both ends of the first electrode are interposed between the inclined surface of the second portion of the planarization layer and the emission structure.

*12. An electroluminescence display device comprising:*

*a thin film transistor on a surface of a substrate facing in a first direction;*

*a planarization layer on the surface of the substrate, the planarization layer covering the thin film transistor, the thin film transistor disposed between the planarization layer and the substrate, the planarization layer having a first area having a first thickness along the first direction, a second area having an inclined surface and a second thickness along the first direction, the first thickness smaller than the second thickness;*

*a first electrode on the first area of the planarization layer and over the inclined surface of the second area of the planarization layer, the first electrode electrically connected to the thin film transistor;*

*a bank layer on a portion of the second area of the planarization layer, the bank layer including a black pigment;*

*an emission structure including a transport layer and a light emitting layer on a surface of the first electrode facing in the first direction; and*

*a second electrode on a surface of the emission structure facing in the first direction,*

*wherein the emission structure has a different thickness for each of a red sub-pixel area. green sub-pixel area and blue sub-pixel area.*

*13. The electroluminescence display device of claim 12, wherein the first electrode overlaps the inclined surface of the planarization layer.*

*14. The electroluminescence display device of claim 13, wherein the first electrode comprises a first end and a second end that is opposite the first end, the first end and the second end are over the inclined surface.*

*15. The electroluminescence display device of claim 12, wherein the emission structure is over the inclined surface of the planarization layer.*

*16. The electroluminescence display device of claim 15, wherein the emission structure extends over an upper surface of the second area of the planarization layer.*

*17. The electroluminescence display device of claim 16, wherein the emission structure extends over an upper surface of the bank layer.*

*18. The electroluminescence display device of claim 12, wherein the second electrode is over the inclined surface of the planarization layer.*

*19. The electroluminescence display device of claim 18, wherein the second electrode extends over an upper surface of the second area of the planarization layer.*

*20. The electroluminescence display device of claim 19, wherein the second electrode extends over the bank layer.*

*21. The electroluminescence display device of claim 12, further comprising:*

*a spacer on the bank layer, the spacer having an end that does not extend beyond an end of the bank layer.*

*22. The electroluminescence display device of claim 21, wherein the spacer is transparent.*

*23. The electroluminescence display device of claim 12, wherein the planarization layer is between the first electrode and the thin film transistor.*

*24. The electroluminescence display device of claim 12, wherein the first electrode comprises a plurality of layers.*

*25. The electroluminescence display device of claim 24, wherein the plurality of layers of the first electrode includes a transparent layer and a reflective layer.*

*26. The electroluminescence display device of claim 12, wherein the bank layer includes a portion that is transparent.*

*27. The electroluminescence display device of claim 12, further comprising:*

*at least one interlayer between first electrode and substrate.*

* * * * *